United States Patent
Pan et al.

(10) Patent No.: US 8,283,843 B2
(45) Date of Patent: Oct. 9, 2012

(54) LIGHT EMISSIVE CERAMIC LAMINATE AND METHOD OF MAKING SAME

(75) Inventors: Guang Pan, Carlsbad, CA (US); Hironaka Fujii, Carlsbad, CA (US); Hiroaki Miyagawa, Oceanside, CA (US); Rajesh Mukherjee, Irvine, CA (US); Bin Zhang, San Diego, CA (US); Toshitaka Nakamura, Osaka (JP); Amane Mochizuki, Carlsbad, CA (US)

(73) Assignee: Nitto Denko Corporation, Osaka (JP)

( * ) Notice: Subject to any disclaimer, the term of this patent is extended or adjusted under 35 U.S.C. 154(b) by 47 days.

(21) Appl. No.: 13/016,665

(22) Filed: Jan. 28, 2011

(65) Prior Publication Data

US 2011/0210658 A1 Sep. 1, 2011

Related U.S. Application Data

(60) Provisional application No. 61/301,515, filed on Feb. 4, 2010.

(51) Int. Cl.
*H01J 5/16* (2006.01)

(52) U.S. Cl. ........ 313/112; 313/111

(58) Field of Classification Search ......... 313/110, 313/111, 112
See application file for complete search history.

(56) References Cited

U.S. PATENT DOCUMENTS

| | | |
|---|---|---|
| 5,998,925 A | 12/1999 | Shimizu et al. |
| 6,069,440 A | 5/2000 | Shimizu et al. |
| 6,844,285 B1 | 1/2005 | Wei |
| 7,361,938 B2 | 4/2008 | Mueller et al. |
| 7,514,721 B2 | 4/2009 | Krames et al. |
| 7,799,267 B2 | 9/2010 | Messing et al. |
| 7,800,287 B2 | 9/2010 | Zheng et al. |
| 2005/0269582 A1 | 12/2005 | Mueller et al. |
| 2009/0108507 A1 | 4/2009 | Messing et al. |
| 2009/0155943 A1 | 6/2009 | Krames et al. |
| 2009/0212697 A1 | 8/2009 | Nakamura et al. |
| 2011/0284902 A1* | 11/2011 | Daicho et al. .......... 257/98 |

FOREIGN PATENT DOCUMENTS

| | | |
|---|---|---|
| WO | 2007/063460 A1 | 6/2007 |
| WO | 2008/025723 A1 | 3/2008 |
| WO | 2008/112710 A1 | 9/2008 |
| WO | 2009/038674 A2 | 3/2009 |
| WO | 2009/105581 A1 | 8/2009 |
| WO | 2010/010484 A1 | 1/2010 |

OTHER PUBLICATIONS

Ohkubo et al., "Absolute Fluorescent Quantum Efficiency of NBS Phosphor Standard Samples," 87-93, J. Illum Eng Inst. Jpn. vol. 83, No. 2, 1999.

* cited by examiner

*Primary Examiner* — Vip Patel
(74) *Attorney, Agent, or Firm* — Law Office of Katsuhiro Arai

(57) ABSTRACT

A ceramic composite laminate includes a wavelength-converting layer and a non-emissive layer, wherein the ceramic composite laminate has a wavelength conversion efficiency (WCE) of at least 0.650. The ceramic composite laminate can also include a wavelength-converting ceramic layer comprising an emissive material and a scattering material, wherein the laminated composite has a total transmittance of between about 40% to about 85%. The wavelength-converting layer may be formed from plasma YAG:Ce powder.

36 Claims, 12 Drawing Sheets

LIGHT EMISSIVE CERAMIC LAMINATE AND METHOD OF MAKING SAME

CROSS-REFERENCE TO RELATED APPLICATIONS

This application claims the benefit of U.S. Provisional Application No. 61/301,515, filed Feb. 4, 2010, and the disclosure of which is herein incorporated by reference in its entirety.

BACKGROUND OF THE INVENTION

1. Field of the Invention

This disclosure relates to luminescent layers suitable for light-emitting devices, such as laminated translucent and transparent ceramic elements and methods for making the same.

2. Description of the Related Art

Solid state light-emitting devices such as light-emitting diodes (LEDs), organic light-emitting diodes (OLEDs) sometimes called organic electroluminescent devices (OELs), and inorganic electroluminescent device (IEL) have been widely utilized for various applications such as flat panel displays, indicators for various instruments, signboards, and ornamental illuminations, etc. As the emission efficiency of these light-emitting devices continues to improve, applications that require much higher luminance intensity, such as automobile headlights and general lighting, may soon become feasible. For these applications, white LED is one of the promising candidates and has attracted much attention.

Conventional white LED's are manufactured based on a combination of blue LED and yellow light-emitting YAG:Ce phosphor powder used as a wavelength-converting material dispersed in an encapsulant resin such as epoxy and silicone, as disclosed in U.S. Pat. No. 5,998,925 and U.S. Pat. No. 6,069,440. The wavelength-converting material is so disposed as to absorb some part of the blue LED light-emission and re-emit the light at a different wavelength as yellow or green-yellow light. The combination of the blue light from the LED and the green-yellow light from the phosphor results in perceived white light. A typical device structure is shown in FIGS. 1A and 1B. A submount 10 shown in FIG. 1A has a blue LED 11 mounted thereon, covered with a transparent matrix 13 in which YAG:Ce phosphor powder 12 is dispersed and encapsulated by a protective resin 15. As shown in FIG. 1B, the blue LED 11 is covered with a transparent matrix 13 in which YAG:Ce phosphor powder 12 is disposed. However, since the particle size of YAG:Ce phosphor powder utilized for this system is around 1-10 μm, the YAG:Ce powder 12 dispersed in the transparent matrix 13 can cause strong light scattering. As a result, as shown in FIG. 2, a considerable portion of both incident light 18 from the blue LED 11 and yellow light 19 emitted from the YAG:Ce powder ends up being backscattered and dissipated, causing a loss of white light emission.

One solution to this problem is to form a monolithic ceramic member as a wavelength-converting material. The ceramic member can be constituted by plural ceramic layers of single or multiple phosphors, or transparent layers. The transparent ceramic layers may be constituted by, for example, the same host material as the wavelength-converting material, but may be devoid of any dopant (U.S. Pat. No. 7,361,938). These laminated layers may also be in the form of luminescent ceramic cast tapes, which can be laminated and co-fired (U.S. Pat. No. 7,514,721 and U.S. Published Application No. 2009/0108507). However, since these laminated layers are generally formed from garnet powder of low IQE (Internal Quantum Efficiency) produced through solid state reaction or co-precipitation, the present inventors recognized that the resultant luminosity generated by these luminescent layers is poor even though the cost of manufacture is low. Phosphor nanoparticles produced by radio frequency thermal plasma treatment of liquid precursors showed high wavelength conversion efficiency (WO2008/112710) and very well controlled stoichiometry, but generally have high production costs. As a result, monolithic ceramic plates composed entirely of plasma nanoparticles would increase production costs.

In addition, high IQE nanoparticles, when formed into ceramics, do not necessarily result in ceramic layers characterized by high wavelength conversion efficiency (WCE). IQE is a measure of the conversion efficiency of the photons striking the emissive material converted into the photons emitted by the emissive material. WCE is a measure of the conversion efficiency of blue light converted into white light. Thus, in white light emitting devices, WCE is of particular importance.

The present inventors recognized that thin layers of phosphor ceramics with sufficiently high activator content having a thickness on the order of tens of microns/micrometers can reduce production costs significantly. Nevertheless, while being appropriate for color conversion, the thin phosphor layers are rendered fragile and difficult to handle. Thus, the present inventors recognized that there is a need for an effective way to enhance the light output from white LEDs while minimizing the backscattering loss without sacrificing luminance intensity of phosphor powder.

SUMMARY OF THE INVENTION

Some embodiments provide a light emissive ceramic composite laminate comprising at least one wavelength-converting ceramic layer (also referred to as an "emissive layer") comprising an emissive material, and at least one non-emissive layer of a substantially transparent ceramic material, wherein the wavelength-converting ceramic layer and the non-emissive layer are laminated in a thickness direction, and the ceramic composite laminate has a wavelength conversion efficiency (WCE) of at least about 0.650 (in other embodiments, at least about 0.700) for intended light incident. In some embodiments, the non-emissive transparent layer optionally has a thickness greater than that of the wavelength-converting ceramic layer. In still further embodiments, the wavelength-converting and non-emissive layers are optionally in the form of sintered ceramic tape cast layers. In some embodiments, the emissive layer itself has a WCE of at least about 0.650 and optionally a transmittance of about 50% to about 80% (as measured for 800-nm light).

Some embodiments provide a light emissive ceramic composite laminate comprising at least one wavelength-converting ceramic layer (also referred to as an "emissive layer") comprising an emissive material and a scattering material, and at least one non-emissive layer of a substantially transparent ceramic material, wherein the wavelength-converting ceramic layer and the non-emissive layer are laminated in a thickness direction, and the ceramic composite laminate has a total transmittance of between about 40% to about 85%. In some embodiments, the emissive material is YAG:Ce. In some embodiments, the scattering material comprises $Al_2O_3$.

Some embodiments provide a light-emitting device comprising: (a) a semiconductor light-emitting source for emitting a path of light, and (b) a light emissive ceramic composite laminate disposed adjacent to the semiconductor light-emitting source in the path of light to receive light emitted from the semiconductor light-emitting source, the composite laminate comprising (b1) a wavelength-converting ceramic layer of an emissive material, the wavelength-converting ceramic layer having a wavelength conversion efficiency of at least about 0.650, and (b2) a non-emissive layer of a substantially transparent ceramic non-emissive material. In some embodiments, the non-emissive transparent layer optionally has a thickness greater than that of the emissive layer. In some embodiments, the wavelength-converting and non-emissive layers are optionally in the form of sintered ceramic tape cast layers.

As illustrated in FIG. 10, some embodiments provide a method of manufacturing an emissive YAG:Ce composite laminate, comprising (i) providing at least one cast tape formed of a non-emissive material and at least one cast tape formed of an emissive material, having a wavelength conversion efficiency of at least about 0.650 (step 1), (ii) stacking portions of the cast tapes to form an assembly (step 2), (iii) compressing the assembly to produce a preform (step 3), (iv) heating the preform to produce a green preform (step 4), and (v) sintering the green preform to produce an emissive YAG:Ce composite laminate (step 5).

These and other embodiments are described in greater detail below.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION

Figure 8:
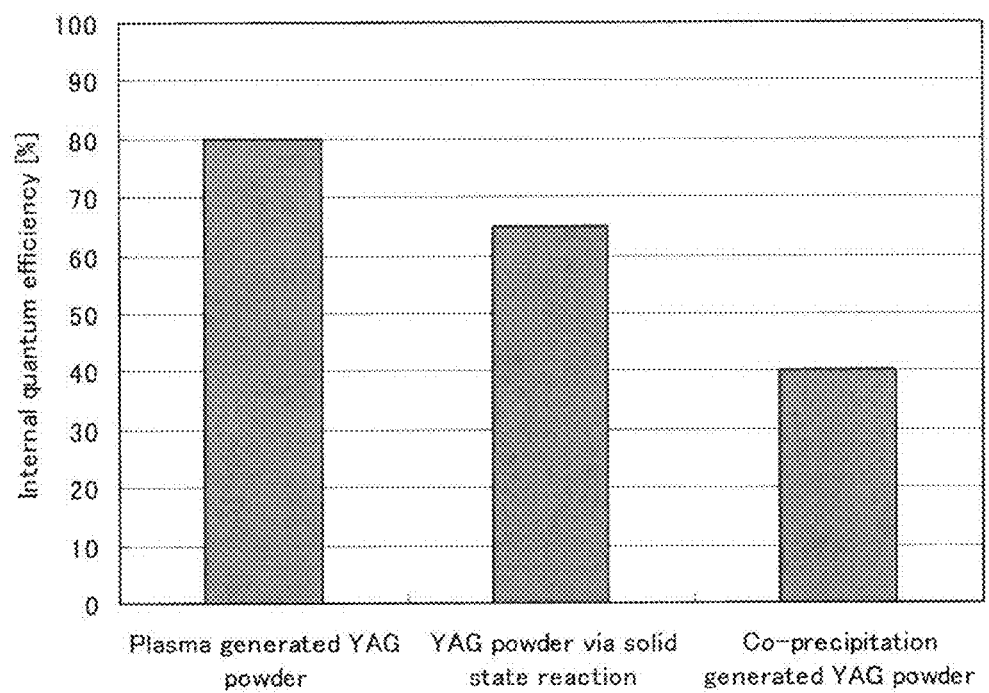
FIG. 8 illustrates a graph depicting the internal quantum efficiency [%] of flow-based thermochemically synthesized (e.g., RF thermal plasma) YAG:Ce powder, solid state synthesized powder, and wet solution (co-precipitated) synthesized powder.
Figure 9:
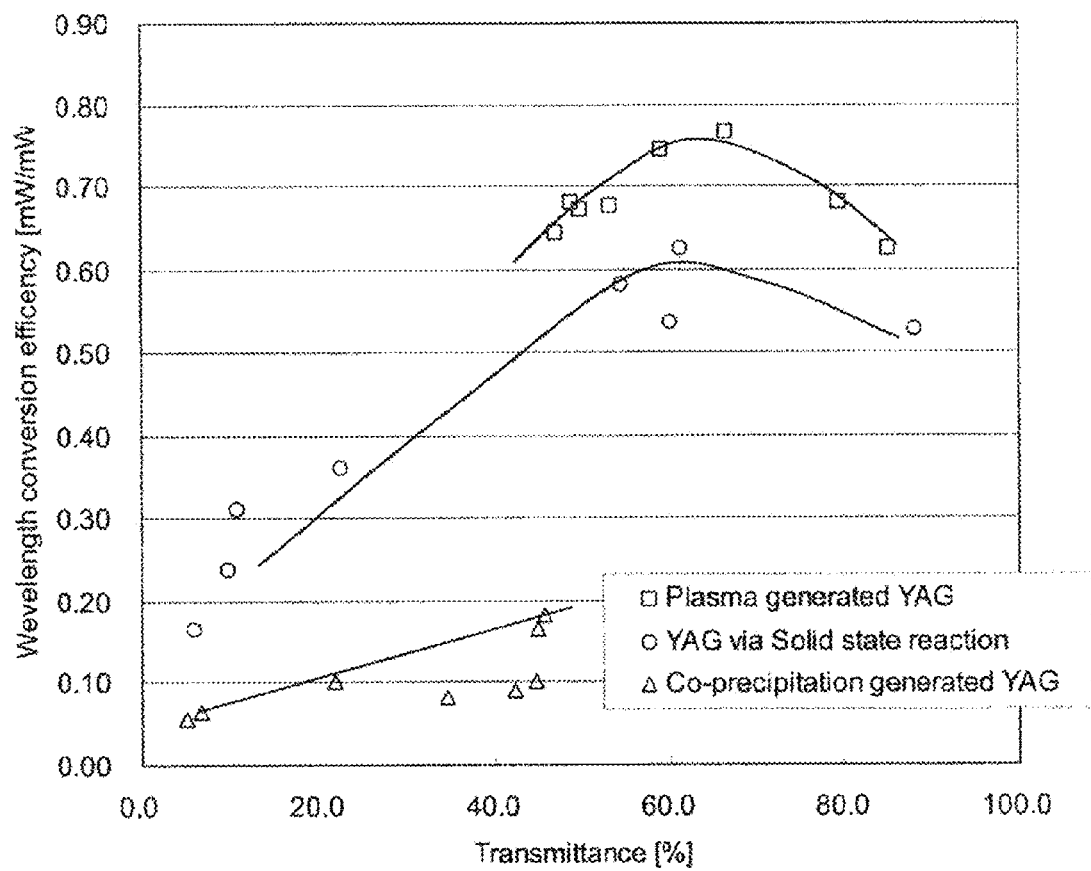
FIG. 9 illustrates a graph depicting the relationship between wavelength conversion efficiency [mW/mW] and transmittance [%] of an emissive layer formed from flow-based thermochemically synthesized YAG:Ce powder, an emissive layer formed from solid state synthesized powder, and an emissive layer formed from wet solution (co-precipitated) synthesized powder.

Multiple methods are available for the preparation of emissive materials for phosphors, including wet chemical co-precipitation, hydrothermal synthesis, supercritical synthesis, solid state reaction, combustion, laser pyrolysis, flame spray, spray pyrolysis, and plasma synthesis. Among these processes, flow-based thermochemical synthesis routes such as laser pyrolysis, flame spray, spray pyrolysis and plasma synthesis are especially suitable for industrial scale synthesis of high purity, crystalline defect-free and highly efficient phosphors. Among these processes, plasma synthesis, especially radio frequency (RF) inductively coupled thermal plasma synthesis, leads to exceptionally high purity of end products since no combustible gases (fuels such as methane in flame spray) are used and the products do not come in contact with any electrodes during synthesis. As taught in patent publication WO2008/112710, size-controlled, high purity and high luminous efficiency phosphor particles can be produced by passing a precursor solution in atomized form into the hot zone of a RF thermal plasma torch and thereby nucleating phosphor particles. These particles can then be collected on suitable filter elements. For example, cerium-doped yttrium-aluminum oxide particles can be synthesized using an aqueous solution of stoichiometric quantities of yttrium nitrate, aluminum nitrate, and cerium nitrate by atomizing this solution via two-fluid atomization in the center of a RF plasma torch, thereby evaporating and decomposing the precursors followed by nucleation of Y—Al—O particles. These particles can be extracted from the effluent gases using an appropriate filtering mechanism. The collected particles when subjected to thermal annealing in an appropriate furnace at temperatures above 1000° C. can completely or substantially completely be converted to phase pure cerium-doped yttrium aluminum garnet ($Y_3Al_5O_{12}$) particles with a wavelength conversion efficiency of at least 0.65 when in the form of a ceramic layer or sheet. Dopant levels are determined depending upon the desired application and any person skilled in the art can appreciate that changes of the dopant level can be achieved without undue experimentation and without deviating from the fundamentals of this concept. The present inventors have discovered that ceramic layers comprising RF plasma synthesized phosphors have the highest wavelength conversion efficiency as compared to those ceramics comprising materials obtained by other methods of phosphor synthesis as illustrated in FIGS. 8 and 9 (which will be further explained later in Examples).

In the present disclosure where conditions and/or structures are not specified, the skilled artisan in the art can readily provide such conditions and/or structures as a matter of routine experimentation in view of the present disclosure and, as necessary, the disclosure of WO2008/112710 for producing cerium-doped YAG powder using RF thermal plasma synthesis, which is incorporated by reference in its entirety. For example, in order to obtain a ceramic layer formed of Ce-doped YAG powder, providing a ceramic composite laminate having a wavelength conversion efficiency (WCE) of at least 0.65, the dispersion of the dopant or activator within the ceramic can be used as a control variable. When the dispersion is increased, the WCE of the laminate is 0.65 or higher and the ceramic laminates are surprisingly and unexpectedly improved as compared with a WCE of lower than 0.65. The art does not recognize the significance of the WCE values and also could not control the WCE values and could not constantly produce a ceramic laminate having a WCE of at least 0.65.

Figure 1A:
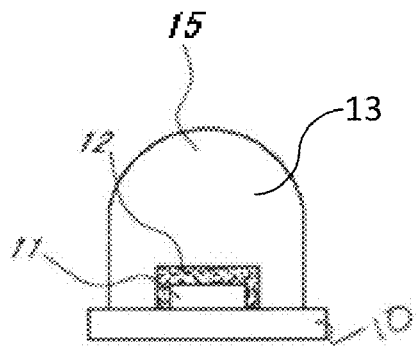
FIGS. 1A and 1B illustrate a cross-sectional view of conventional white LED devices.
Figure 1B:
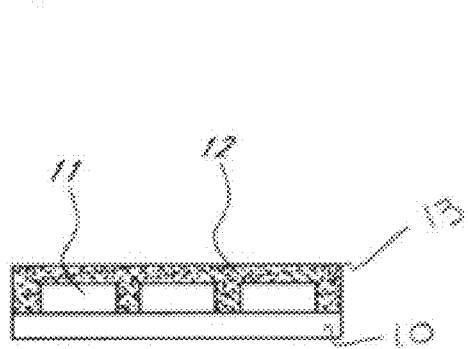
Figure 2:
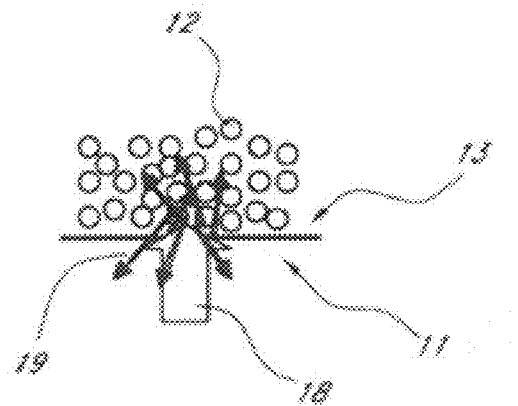
FIG. 2 illustrates how the light emitted from a blue LED device is backscattered by micron-sized yellow phosphor powder in the conventional white LED devices.
Figure 3:
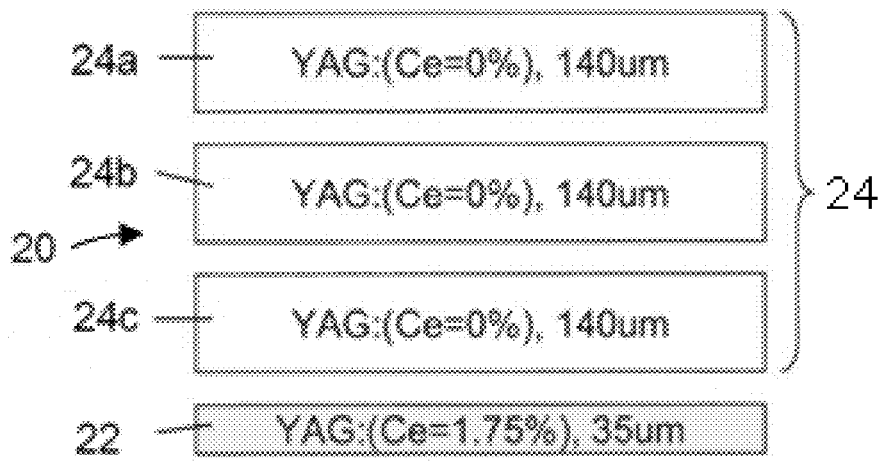
FIG. 3 illustrates a cross-sectional view of an embodiment of a wavelength-converting ceramic laminated structure.

As shown in FIG. 3, one embodiment of the present invention provides a laminated composite 20 having a wavelength conversion efficiency of at least about 0.650 comprising at least one wavelength-converting ceramic layer 22 including an emissive material, the layer 22, and at least one non-emissive layer 24 (here three layers 24a, 24b and 24c) of a substantially transparent material, wherein said non-emissive transparent layer 24 optionally may have a thickness greater than that of the wavelength-converting layer 22. The wavelength-converting and non-emissive layers may optionally be in the form of sintered ceramic tape cast layers. In some embodiments, each non-emissive layer 24 can be formed not only from YAG powder but also from $Al_2O_3$ powder, $Y_2O_3$ powder, or other oxide powder, which can be produced by inexpensive processes such as SSR (Solid State Reaction) synthesis. In some embodiments, the non-emissive layer is not doped with another element or can be doped to the extent of exhibiting non-emissive characteristics. In some embodiments, each wavelength-converting ceramic layer 22 is preferably formed from Ce-doped YAG powder which can be produced by RF thermal plasma synthesis so as to effectively impart high wavelength conversion efficiency (e.g., 0.65 or higher, including 0.70, 0.75, or higher) to the emissive layer. In some embodiments, each wavelength-converting ceramic layer 22 and each non-emissive layer 24 are in the form of sintered ceramic tape cast layers. In some embodiments, the emissive material comprises a flow-based thermochemically synthesized material. In some embodiments, the emissive material comprises a radio-frequency inductively-coupled thermal plasma synthesized YAG:Ce.

In one embodiment, the thickness of the wavelength-converting ceramic layer 22 is between about 10 to about 1000 μm. In another embodiment, the thickness of the wavelength-converting ceramic layer 22 is between about 15-100 μm. In another embodiment, the thickness of the wavelength-converting ceramic layer 22 is between about 20-80 μm. In another embodiment, the thickness of the wavelength-converting ceramic layer 22 is between about 30-70 μm. In still another embodiment, the thickness of the wavelength-converting ceramic layer 22 may be between any two of the foregoing numbers. In some embodiments, the wavelength-converting ceramic layer 22 comprises an activating dopant having a concentration of about 0.05 mol % to about 10.0 mol % relative to a primary element of the wavelength-converting ceramic layer and the substantially transparent ceramic material is a non-doped garnet material. In one embodiment, the dopant concentration (mol % relative to the yttrium content) is about 1.75% for a YAG:Ce layer of about 35 μm in thickness. In one embodiment, the dopant concentration is about 1.75% for a YAG:Ce layer of about 65 μm to about 325 μm in thickness. The wavelength-converting ceramic layer 22 can be a single layer or a plurality of layers each independently having the described thickness. In some embodiments, the dopant concentration (1.75%) may be altered by 5% to 50%, for example, to the extent of exhibiting desired light emissive characteristics. In one embodiment, the dopant concentration is about 1.75% to 2.0% for a YAG:Ce layer of about 35 μm to about 40 μm and the non-emissive layer is about 350 μm to about 600 μm.

In one embodiment, the non-emissive layer 24 is between about 30 μm to about 1000 μm. In another embodiment, the thickness of the non-emissive layer is between about 50-750 μm. In another embodiment, the thickness of the emissive layer is between about 300-500 μm. In still another embodiment, the thickness of the non-emissive layer may be any number between any two of the foregoing numbers. The non-emissive layer 24 can be a single layer or a plurality of layers each independently having the described thickness. In some embodiments, the sum total thickness of the individual layers 24a, 24b and 24c in FIG. 3 can have the aforedescribed thickness. In some embodiments, the total thickness of the non-emissive layers is greater than the total thickness of the wavelength-converting ceramic layer(s). In some embodiments, each of the non-emissive layers has a thickness greater than that of each wavelength-converting ceramic layer. In some embodiments, each non-emissive layer is in the form of cast tape (including a non-doped host material) which can have a thickness of between about 50 μm to about 200 μm, between about 60 μm to 175 μm, or between 85 μm and 155 um, or between any two of the foregoing numbers. In one embodiment, optionally the ratio of the thickness of the wavelength-converting ceramic layer 22 to the non-emissive layer 24 to is about 1/1 or less to about 1/250 or less. In another embodiment, the ratio of the thickness of the wavelength-converting ceramic layer 22 to the non-emissive layer 24 is about 1/5 or less to about 1/20 or less. In another embodiment, the ratio of the thickness of the wavelength-converting ceramic layer 22 to the non-emissive layer 24 is about 35/420, and in another embodiment is about 40/450. In one embodiment, the ratio of thickness of the wavelength-converting ceramic layer 22 to the non-emissive layer 24 is about 1/3 or less. In another embodiment, the ratio of thickness of the wavelength-converting ceramic layer 22 to the non-emissive layer 24 is about 1/10 or less. In another embodiment, the ratio of thickness of the wavelength-converting ceramic layer 22 to the non-emissive layer 24 may be between any two of the foregoing ratios.

In one embodiment, the wavelength-converting ceramic layer 22 formed of selected materials has high efficacy of wavelength conversion. The wavelength conversion efficiency can be defined as an efficiency of the material to absorb radiation at one or more wavelengths and re-emit radiation in one or more different wavelengths. The wavelength conversion efficiency can be calculated as described later.

Figure 7A:
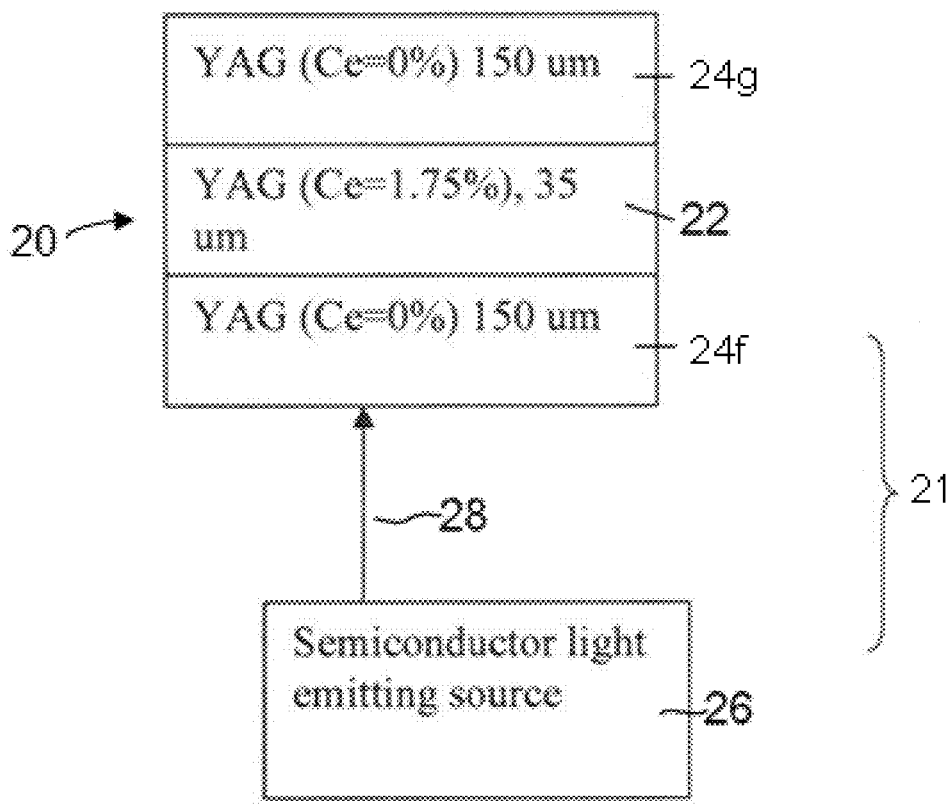
FIG. 7a illustrates a cross-sectional view of an embodiment of a light-emitting device.
Figure 7B:
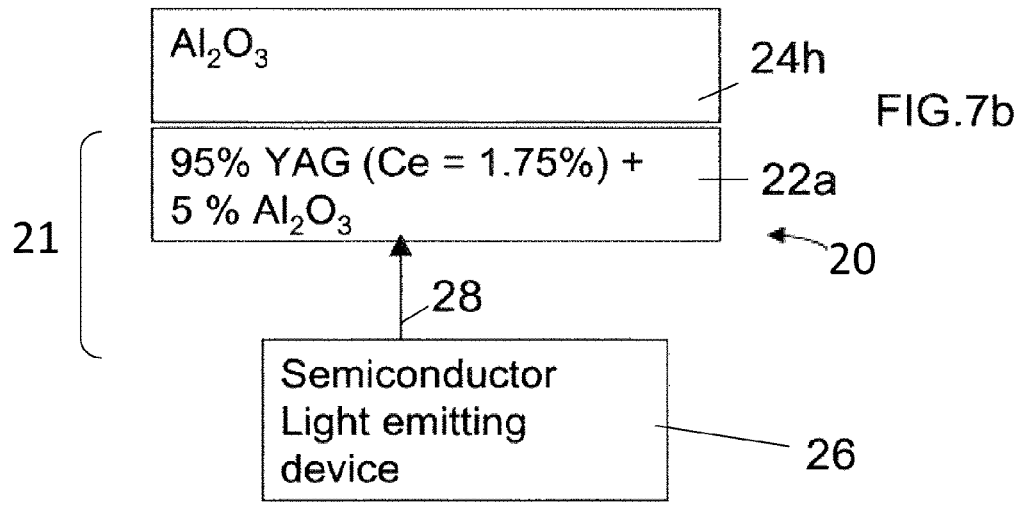
FIG. 7b illustrates a cross-sectional view of an embodiment of a light-emitting device.

As shown in FIG. 7b, in some embodiments the present invention provides a light emissive ceramic composite laminate 20 comprising at least one wavelength-converting ceramic layer 22a comprising an emissive material and a scattering material, and at least one non-emissive layer 24 (here three layers 24a, 24b and 24c) of a substantially transparent material. As used herein, the term "scattering material" refers to a material that has a refractive index that is different from the refractive index of the emissive material and is substantially transparent. In some embodiments, the scattering material is disposed in plural discrete scattering centers dispersed throughout the emissive material. In some embodiments the scattering material includes, but is not limited to, $Al_2O_3$, $Y_2O_3$, CaO, $TiO_2$, MgO, $La_2O_3$, $CeO_2$, $Nd_2O_3$, $Tb_4O_7$, $Eu_2O_3$, BaO, $Gd_2O_3$, and the like. In some embodiments, the emissive material comprises at least one phosphor material, and the scattering material comprises at least one metal oxide corresponding to the phosphor emissive material. In some embodiments, the emissive material may comprise $Y_3Al_5O_{12}$ doped with a rare earth metal (for example, $Y_3Al_5O_{12}$:Ce) while the scattering material comprises at least one of the following metal oxides corresponding to $Y_3Al_5O_{12}$:Ce, e.g., $Y_2O_3$, $Al_2O_3$, $YAlO_3$ (Yttrium Aluminum Perovskite or YAP) and $Y_4Al_{12}O_9$ (Yttrium Aluminum Monoclinic or YAM).

In some embodiments, the volume of the emissive material is between about 85% to about 99.99% of the total volume of the wavelength converting ceramic layer In some embodiments, the volume of the scattering material is between about 15% and about 0.01% of the volume of the combined total of the emissive material and scattering material within wavelength converting ceramic layer. In some embodiments, the volume % of the emissive material is between about 90% and about 99.99%, about 95% and about 99%, or about 98% and about 99%; and the volume % of the scattering material is between about 10% and about 0.01%, about 7% and about 0.01%, about 5% and about 0.01%, about 3% and about 0.01%, about 2% and about 0.01%, or about 1% and about 0.01%.

In some embodiments, the composite comprising emissive material and scattering material is particularly effective in balancing the high transparency and limited backscattering when the volume ratio of the emissive material to the scattering material is predominantly heavy in the emissive material, for example, about 85% emissive material and about 15% scattering material, about 90% emissive material and about 10% scattering material, about 95% emissive material and about 5% scattering material, about 98% emissive material and about 2% scattering material and about 99% emissive material and about 1% scattering material.

In some embodiments, the wavelength converting ceramic layer comprises about 85% to about 99.99% by volume of an emissive material and about 15% to about 0.01% by volume of a scattering material. The said at least one sintered ceramic laminate is capable of absorbing at least a portion of the light emitted from said light emitting component and emitting light of a second peak wavelength, wherein said sintered ceramic laminate has a total light transmittance at the second peak wavelength of greater than about 40%.

In some embodiments, the composite comprises a volume ratio of the emissive material to the scattering material is predominantly heavy in the scattering material, for example, about 85% scattering material and about 15% emissive material, about 90% scattering material and about 10% emissive material, about 95% scattering material and about 5% emissive material, about 98% scattering material and about 2% emissive material and about 99% scattering material and about 1% emissive material.

In some embodiments, the volume ratios of the emissive material to scattering material within the wavelength converting ceramic layer comprises about 85% to about 99.99% by volume of a scattering material and about 15% to about 0.01% by volume of an emissive material. The said at least one sintered ceramic plate is capable of absorbing at least a portion of the light emitted from said light emitting component and emitting light of a second peak wavelength, wherein said sintered ceramic laminate has a total light transmittance at the second peak wavelength of greater than about 40%.

While not wanting to be limited by theory, the inventors believe by incorporating scattering material and/or scattering centers within the wavelength-converting ceramic layer enables the light entering the scattering material, having an intermediate same index of refraction between the emissive phase material and the ambient environment, e.g., air, to be less impeded by the optical interface between the wavelength-converting ceramic layer and/or the non-emissive layer and the ambient environment. It is thought that, once the light emitted by the emissive material enters the scattering material, it is impeded to a lesser extent by the difference in refractive indices of the wavelength converting ceramic layer and air due to refractive indices and angles of reflection, providing enhanced extraction of emitted light.

Figure 7C:
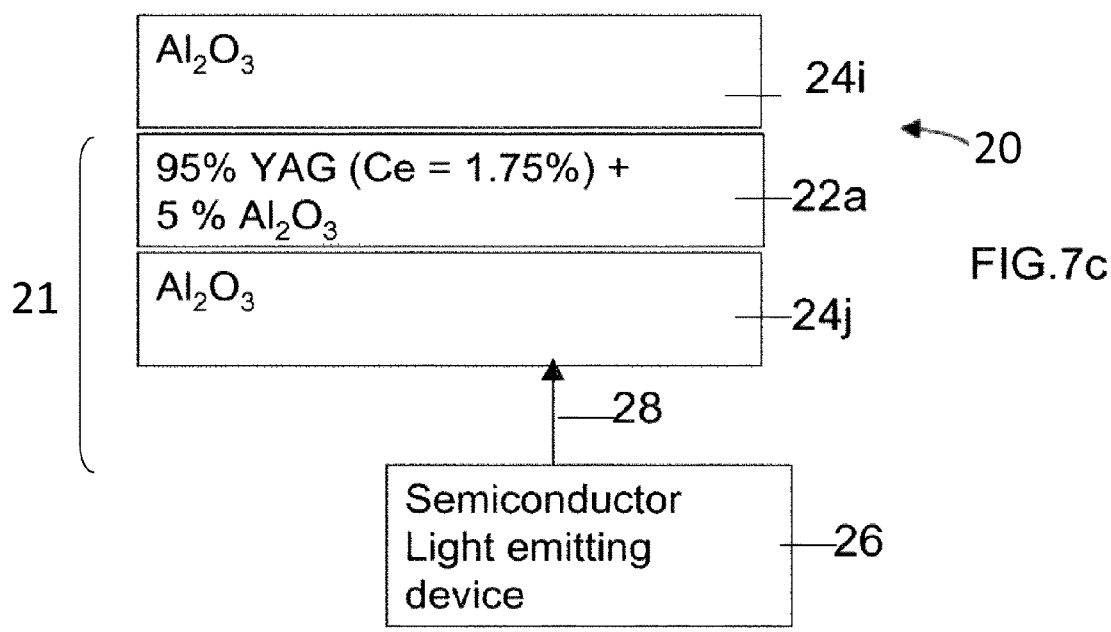
FIG. 7c illustrates a cross-sectional view of an embodiment of a light-emitting device.

In some embodiments, as shown in FIG. 7c, the composite laminate 20 further comprises at least one additional non-emissive layer 24i laminated on the at least one wavelength-converting ceramic layer 22a opposite to the at least one non-emissive layer 24j. In some embodiments, the non-emissive layers comprise material having an index of refraction less than that of the emissive layer, but greater than the air voids or the ambient environment. In one embodiment, the non-emissive layers comprise $Al_2O_3$, having a refractive index of about 1.63. While not wanting to be limited by theory, in this embodiment, it is thought the difference in refractive index provides a directing of emitted light within the emissive layer, increasing the light directed to the scattering material and thus enhanced extraction as discussed above. In another embodiment, the non-emissive layer comprises a dopant blocking element, wherein the doping blocking element substantially reduces the amount of dopant, e.g., Ce, diffusing from the emissive layer into the non-emissive layer. In some embodiments, the dopant blocking material and the non-emissive material can be the same. In some embodiments, the material that can be the dopant blocking and non-emissive material comprises $Al_2O_3$.

As shown in FIG. 9 which will be explained later in the Examples, ceramic laminate composites, comprising emissive layers fabricated from a flow-based thermochemically synthesized material, such as plasma-generated YAG:Ce, have a wavelength conversion efficiency (WCE) of at least 0.600, preferably 0.650 or higher, in some embodiments of at least 0.675 and in some embodiments of at least 0.700. Not wanting to be limited by theory, the inventors believe that, by at least controlling the heterogeneity of precursor dispersion at the atomic level and/or increasing the diffusion of the Ce within the wavelength-converting ceramic layer 22, the WCE of ceramic laminate composites comprising plasma-generated YAG:Ce can be always 0.650 or higher (in FIG. 9, some of plasma-generated YAG:Ce show a WCE of less than 0.650, and this is because the precursors, especially the dopant or activator element, e.g., Ce, is not sufficiently uniformly dispersed throughout the emissive material). In contrast, emissive layers comprised of YAG:Ce synthesized by solid state reaction (SSR) synthesis, have a wavelength conversion efficiency of about 0.625 or less. Furthermore, emissive layers comprised of co-precipitation synthesized phosphors have a wavelength conversion efficiency of less than 0.200.

In one embodiment, as illustrated in FIG. 3, the wavelength-converting ceramic layer 22 is disposed below the non-emissive layer 24. The term "below" refers to relative positioning of the emissive layer relative to the non-emissive layer and the light-emitting device, e.g., the emissive layer being "below" the non-emissive layer refers to the emissive layer being proximal to a light source relative to the non-emissive layer (the emissive layer is disposed between the non-emissive layer and the light source) and "above" refers to being distal from a light source relative to the non-emissive layer (the non-emissive layer is disposed between the emissive layer and the light source). The relative positioning includes a position where two layers are physically in contact with each other and a position where two layers are functionally in contact with each other in terms of light emission property.

Figure 4:
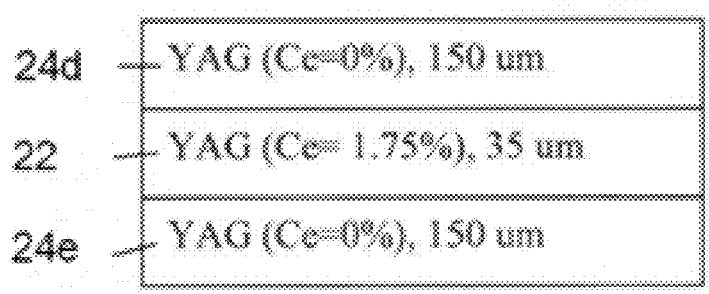
FIG. 4 illustrates a cross-sectional view of another embodiment of a wavelength-converting ceramic laminated structure.

In one embodiment, as illustrated in FIG. 4, the wavelength-converting ceramic layer 22 is disposed or sandwiched between at least two non-emissive layers 24d and 24e. In one embodiment, the laminated composite further provides at least one additional non-emissive layer (24e) laminated on the at least one wavelength converting ceramic layer 22, opposite to the first at least one non-emissive layer (24d).

Figure 5:
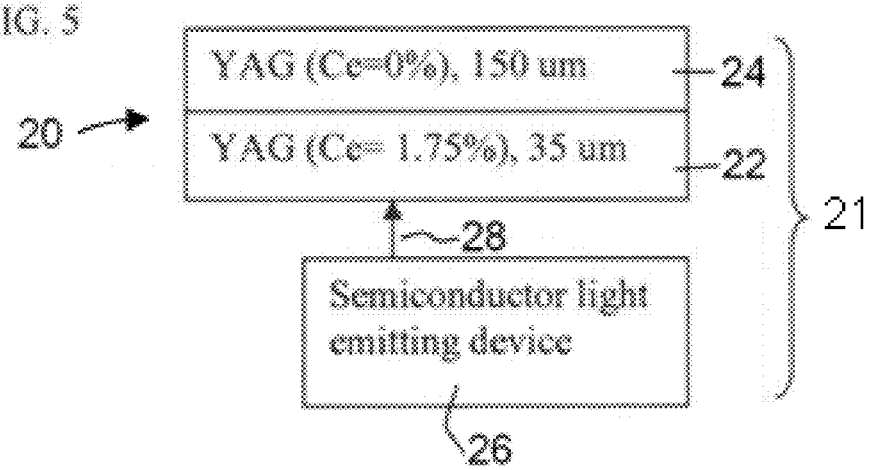
FIG. 5 illustrates a cross-sectional view of an embodiment of a light-emitting device.
Figure 6:
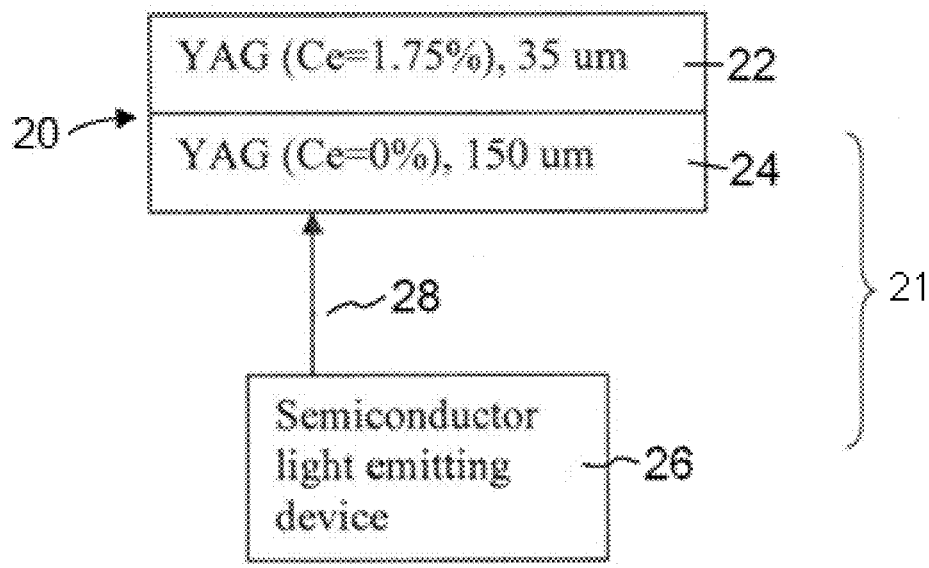
FIG. 6 illustrates a cross-sectional view of an embodiment of a light-emitting device.
Figure 12:
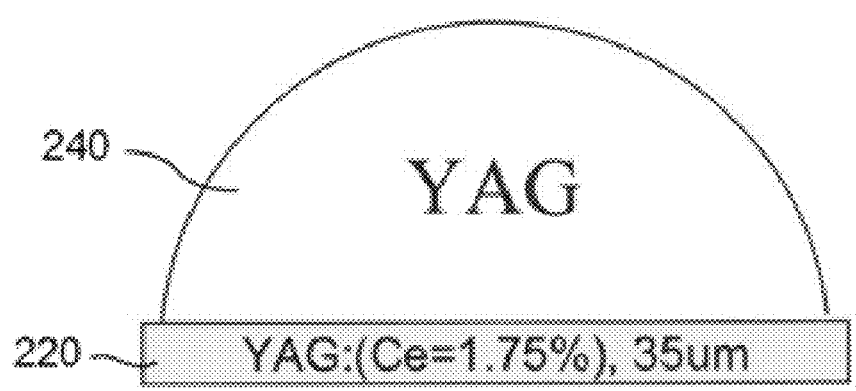
FIG. 12 illustrates another embodiment made in accordance with the disclosed embodiments.

As shown in FIG. 5, in one embodiment, the wavelength-converting ceramic layer 22 is disposed adjacent to the non-emissive layer 24 and adjacent to a light source (e.g., a light-emitting semiconductor) 26. In one embodiment, the laminated composite 20 is positioned in the path of the light 28 emitted by the light source 26. In one embodiment, the light source 26 is a semiconductor light-emitting device which comprises a light-emitting layer disposed between an n-type region and a p-type region. In another embodiment, the light source 26 is an organic light-emitting device which comprises an anode, a cathode, and an organic light-emitting or luminescent layer disposed therebetween. In another embodiment, the wavelength-converting ceramic layer 22 is disposed above the non-emissive layer 24, i.e., the non-emissive layer 24 is disposed between the wavelength-converting ceramic layer 22, in the path of the light 28 emitted by the light source 26, as shown in FIG. 6. In another embodiment, the non-emissive layer 24f is disposed between the wavelength-converting ceramic layer 22 and the light source 26. In another embodiment, the wavelength-converting ceramic layer 22 is disposed between the non-emissive layers 24f and 24g (both proximal to and distal to the respective non-emissive layers 24g, 24f relative to the light source 26) and in the path of light 28 emitted from the light source 26, as shown in FIG. 7a. In some cases, the emissive layer can be very sensitive to a sintering environment including contaminations from furnace materials. For instance, while not wanting to be limited by theory, possible contaminating materials can be deposited on the layer surface, and unfavorable reactions may occur, resulting in an emission efficiency drop perhaps due in part to the rare earth dopant such as cerium in YAG crystal being vulnerable to impurities. For the purpose of emissive layer protection, an optional sandwich structure of non-emissive layer/emissive layer/non-emissive layer is sometimes suitable to avoid an unwanted efficiency drop. In another embodiment, the emissive layer can be protected from operating hazards such as moisture and heat, by sandwiching said emissive layer in between two or more non-emissive transparent layers. In another embodiment where the non-emissive layer 240 is above the wavelength-converting ceramic layer 220, the non-emissive layer 240 comprises a substantially hemispherical convex ceramic member, as depicted in FIG. 12 wherein one member is indicated. Those skilled in the art will recognize that the embodiments described herein can also be adapted to provide a laminate composite having an emissive layer comprising scattering centers.

Figure 12A:
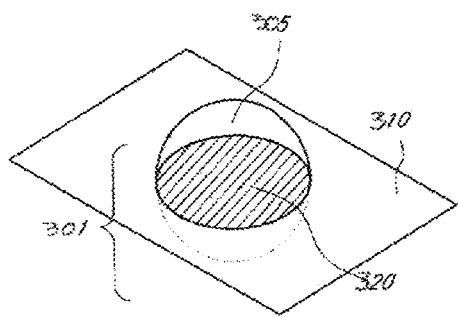
FIG. 12A illustrates an embodiment of "substantially hemispheric" shape.
Figure 12B:
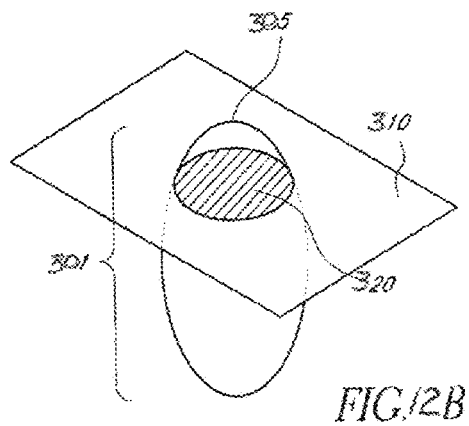
FIG. 12B illustrates another embodiment of "substantially hemispheric" shape.
Figure 12C:
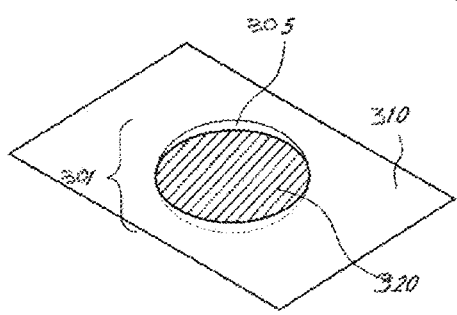
FIG. 12C illustrates another embodiment of "substantially hemispheric" shape.
Figure 12D:
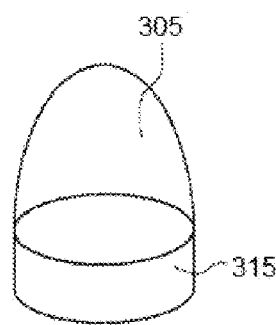
FIG. 12D illustrates another embodiment of "substantially hemispheric" shape.

Turning to FIG. 12, in some embodiments, the non-emissive layer 240 is "substantially hemispheric," meaning that the surface of the non-emissive layer 240 is formed by the smaller shape 305 obtained when a spheroid 301 is cut by a plane 310 as shown in FIGS. 12A to 12C. The spheroid may be a sphere such as in FIG. 12A, a prolate spheroid such as in FIG. 12B, an oblate spheroid such as in FIG. 12C, etc. Alternatively, in some embodiments, as shown in FIG. 12D, the non-emissive layer which is also referred to as a "cover" is "substantially hemispheric" if it comprises a cylinder 315 with the smaller shape 305 at the top of the cylinder 315. There may be some variations other than its general shape. For example, surface roughness, unevenness, or texture can be modified, and secondary structures such as arrayed holes or recesses can be added to the surface as long as the general substantially hemispheric shape would be recognizable to one of ordinary skill in the art. In some embodiments, the substantially hemispheric cover comprises a circular base, meaning that, with reference to FIG. 12E, the shape 320 formed by the intersection of the plane with the spheroid 301 is a circle.

Figure 12E:
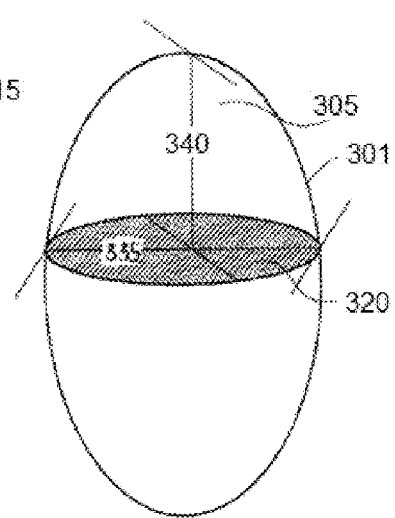
FIG. 12E illustrates an embodiment of height and diameter of "substantially hemispheric" shape.
Figure 12F:
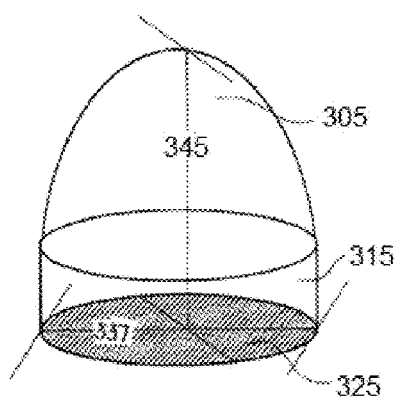
FIG. 12F illustrates another embodiment of height and diameter of "substantially hemispheric" shape.

In some embodiments, as shown in FIG. 12E, the term "height" refers to the distance 340 from the plane cutting the spheroid to the top of the smaller shape 305. In some embodiments, the term "diameter" refers to the longest distance across shape 320. In some embodiments, as shown in FIG. 12F, the term "height" refers to the distance 345, from the plane at the base of the cylinder 325 to the top of the smaller shape 305. In some embodiments, the term "diameter" refers to the diameter 337 of the base of the cylinder 325. In some embodiments, the height/diameter ratio of the substantially spherical cover is in the range of about 0.2 to about 2, about 0.3 to about 0.8, about 0.4 to about 0.6, or alternatively about 0.5. In some embodiments, the substantially hemispheric cover has a diameter in the range of about 4 mm to about 9 mm.

Figure 13:
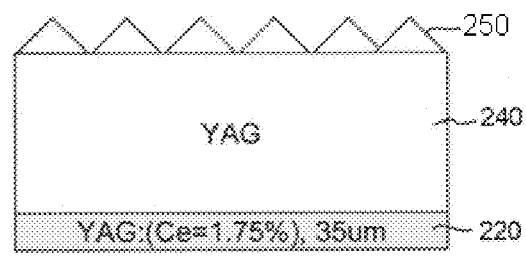
FIG. 13 illustrates another embodiment made in accordance with the disclosed embodiments.

In another embodiment shown in FIG. 13, a surface 250 (any surface interface) of the non-emissive layer 240 can be textured to reduce the effects of total internal reflection at the interface of air and the transparent ceramic layer 240 (e.g., FIG. 13). In some embodiments, the outer layer of the light-emitting device comprises an outer surface, wherein at least a portion of the outer surface has a texture. For example, in some embodiments, the texture may have a depth in the range of about 0.5 μm to about 100 μm. In some embodiments, the outer surface having texture may be useful in reducing the loss of light due to total internal reflectance by the outer layer. In some embodiments, the texture may comprise a regular or patterned microstructure. In some embodiments, the regular or patterned microstructure has a repeating period of about 100 μm, or alternatively about 10 μm, or less. In some embodiments the texture of the surface of the ceramic phosphor may create a microsurface which may be about normal to the hemispheric surface. In some embodiments, the texture of the surface creates a microsurface which is at an angle to the hemispheric surface such that total internal reflection is interrupted. In some embodiments, texture comprises concave and/or convex portions formed on the outer surface of the outer layer or ceramic phosphor. In some embodiments, these convex or concave portions may be randomly distributed over the outer surface. In some embodiments, these concave or convex portions may be periodically or regularly distributed over the outer surface. In some embodiment, an average period of the concave and convex portions may be about 100 μm or less, or alternatively, 10 μm or less.

Any projected shape of the concave and convex portions on the outer surface may be utilized. In some embodiments, the projected shape can be circular, ovoid, a waveform, a trapezoid, a rectangle, a triangle, etc. In some embodiments, a plurality of shapes may be combined. Any cross sectional shape of the concave and convex portions on the outer surface may be utilized. In some embodiments, the cross section may be a waveform, a trapezoid, a rectangle, a triangle, etc. In some embodiments, a plurality of shapes may be combined. It is also possible to use a construction in which the surface is made rough by allowing particles to agglomerate on the outside of a mold during fabrication. Those skilled in the art will recognize that the embodiments described herein can also be adapted to provide a laminate composite having an emissive layer comprising scattering centers. The skilled artisan can readily accomplish the above modifications by a matter of routine experimentation or in a manner disclosed in, for example, U.S. Provisional Application No. 61/183,025, owned by the same entity as in this application, the disclosure of which is herein incorporated by reference in its entirety.

In one embodiment, as shown in FIG. 5, a light-emitting device 21 comprises a semiconductor light-emitting source 26 comprising a light-emitting layer disposed between an n-type region and a p-type region, and a laminated wavelength-converting ceramic composite 20 disposed adjacent to the light-emitting source 26 in a path of light 28 emitted by the light-emitting source 26; and the laminated wavelength-converting ceramic composite 20 comprises a wavelength-converting ceramic layer 22 of an emissive material (the composite laminate, comprising a wavelength-converting ceramic layer, having a wavelength conversion efficiency of at least about 0.650) and a non-emissive layer 24 of a substantially transparent material, wherein the non-emissive transparent layer has a thickness greater than the wavelength-converting ceramic layer, and the wavelength-converting ceramic layer and non-emissive layers are in the form of sintered ceramic tape cast layers. In this embodiment, the wavelength-converting ceramic layer 22 is disposed adjacent to the semiconductor light emitting source 26, e.g., below the non-emissive layer 24 and above the semiconductor light emitting source 26.

In one embodiment, as shown in FIG. 6, a light-emitting device 21 comprises a semiconductor light-emitting source 26 comprising a light-emitting layer disposed between an n-type region and a p-type region, and a laminated wavelength-converting ceramic composite 20 (the laminate wavelength-converting ceramic composite having a wavelength conversion efficiency of at least about 0.650) disposed adjacent to the light-emitting source 26 in a path of light 28 emitted by the light-emitting source 26; and the laminated emissive composite 20 comprises a wavelength-converting ceramic layer 22 of an emissive material and a non-emissive layer 24 of a substantially transparent material, wherein the non-emissive transparent layer has a thickness greater than the emissive layer, and the emissive layer and non-emissive layers are in the form of sintered ceramic tape cast layers. In this embodiment, the non-emissive layer 24 is disposed adjacent to the semiconductor light emitting source 26, e.g., below the wavelength-converting ceramic layer 22 and above the semiconductor light emitting source 26.

In one embodiment, as shown in FIG. 7a, a light-emitting device 21 comprises a semiconductor light-emitting source 26 comprising a light-emitting layer disposed between an n-type region and a p-type region, and a laminated wavelength-converting composite 20 (the wavelength-converting composite laminate having a wavelength conversion efficiency of at least about 0.650) disposed adjacent to the light-emitting source 26 in a path of light 28 emitted by the light-emitting source 26; and the laminated wavelength-converting composite 20 comprises a wavelength-converting ceramic layer 22 of an emissive material, a non-emissive layer 24f of a substantially transparent material, and at least one additional non-emissive layer 24g wherein the additional non-emissive layer 24g is laminated on the wavelength-converting ceramic layer 22 opposite to the other non-emissive layer 24f. Optionally, the non-emissive transparent layers 24f, 24g have a thickness greater than the wavelength-converting ceramic layer 22, and the wavelength-converting ceramic layer 22 and non-emissive layers 24f, 24g are in the form of sintered ceramic tape cast layers.

In another embodiment, an emissive composite laminate can be made according to any of the methods described herein.

In another embodiment, a light-emitting device comprises an emissive composite laminate made according to any of the methods described herein.

Figure 10:
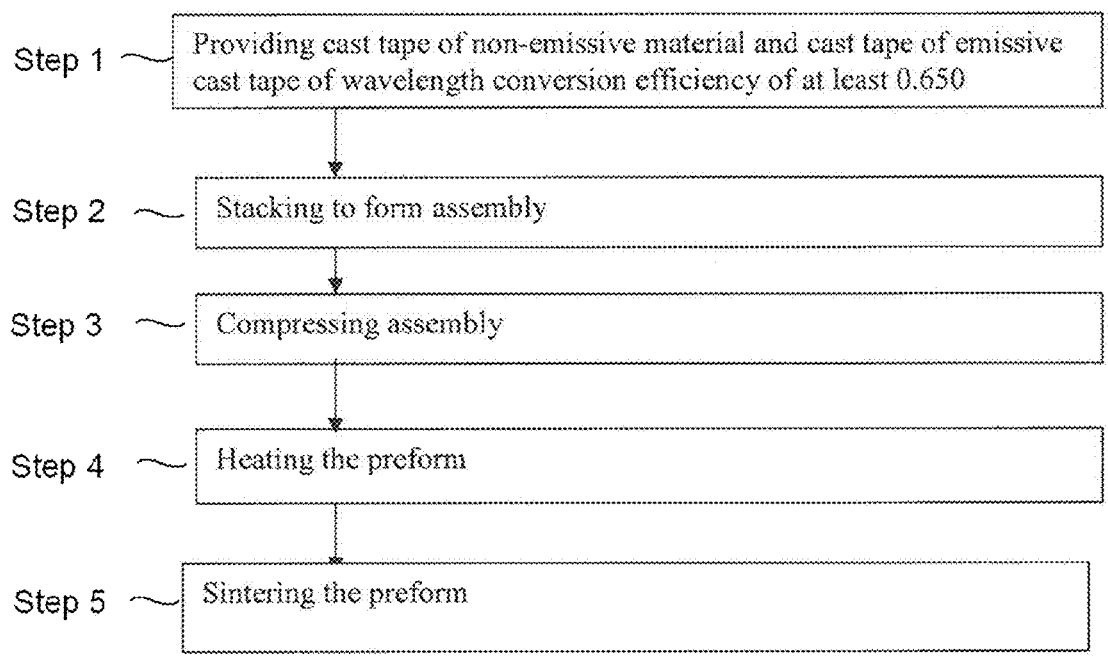
FIG. 10 illustrates an exemplary embodiment of a method of preparing emissive layers disclosed herein.

As illustrated in FIG. 10, some embodiments provide a method of manufacturing an emissive YAG:Ce composite laminate, comprising (i) providing at least one cast tape formed of a non-emissive material and at least one cast tape formed of an emissive material, having a wavelength conversion efficiency of at least about 0.650 (step 1), (ii) stacking portions of the cast tapes to form an assembly (step 2), (iii) compressing the assembly to produce a preform (step 3), (iv) heating the preform to produce a green preform (step 4), and (v) sintering the green preform to produce an emissive YAG:Ce composite laminate (step 5). In some embodiments, the composite laminate has a wavelength efficiency of at least about 0.650 as measured after sintering. In some embodiments, step (i) comprises providing at least one cast tape formed of a non-emissive material and at least one cast tape formed of an emissive material and a scattering material. In some embodiments, the composite laminate has a total transmittance of between about 40% to about 85%. In some embodiments, the composite laminate has a total transmittance of between about 50% to about 70%. In some embodiments, providing of the cast tape formed of the non-emissive material comprises mixing about 3 parts by molarity of $Y_2O_3$, 5 parts by molarity of $Al_2O_3$, dispersant, sintering aid, and organic solvent; ball milling the mixture using balls of a material containing substantially no Y, no Al, and no Ce to produce a milled first slurry; mixing a type 1 and type 2 plasticizer and organic binder into said first slurry to produce a second slurry; milling the second slurry to produce a milled second slurry; tape casting the milled second slurry to produce the non-emissive cast tape; drying the non-emissive cast tape to produce a dried tape; heating and compressing plural layers of the dried tape to form a laminated green sheet; heating the laminated green sheet to remove organic components; and sintering the green sheet to form a transparent or translucent non-emissive ceramic sheet used as the cast tape. In some embodiments, providing of the cast tape formed of the non-emissive material comprises mixing about more than 3 parts by molarity of $Y_2O_3$, or more than 5 parts by molarity of $Al_2O_3$ or both. In some embodiments the non-emissive cast tape comprises YAG powder, each layer of the cast tape having a thickness of about 100 to about 200 µm. In some embodiments, providing the cast tape comprises performing flow-based thermochemical synthesis of stoichiometrically correct phosphor nanoparticles, the nanoparticles having a particle size of between about 30 nm and about 500 nm; preannealing the nanoparticles at a temperature sufficient to substantially convert the nanoparticles to substantially or nearly all garnet phase phosphor nanoparticles with increased particle sizes; mixing the preannealed phosphor nanoparticles, a dispersant, a sintering aid, and an organic solvent; milling the mixture using ball milling using balls comprised of a material not containing any non-oxygen components or potential dopants for the material being milled to produce a milled first slurry; mixing a type 1 and type 2 plasticizer and organic binder into said first slurry to produce a second slurry; milling the second slurry to produce a milled second slurry; tape casting the milled second slurry to produce a cast tape; drying the cast tape to produce a dried tape; heating and compressing a plurality of layers of the dried tape to form a laminated green sheet; heating laminated green sheet to remove organic components; and sintering the green sheet to form a transparent or translucent emissive ceramic sheet used as the cast tape. In some embodiments, the step of providing the cast tape comprises performing flow-based thermochemical synthesis of non-stoichiometrically correct phosphor nanoparticles, In some embodiments, the step of providing the cast tape comprises performing flow-based thermochemical synthesis of stoichiometrically correct phosphor nanoparticles and adding additional second phase material to the mixture, In some embodiments, the nanoparticles comprise a cerium-doped yttrium-aluminum oxide synthesized by a flow-based thermochemically synthesis method. In some embodiments, the nanoparticles are a cerium-doped yttrium-aluminum oxide synthesized using a radio-frequency inductively-coupled thermal plasma. In some embodiments, the method further comprises defining volume or surface features within the composite laminate. In some embodiments, the method further comprises defining void features within the composite laminate, the void features being selected from apertures extending completely through the composite laminate, or apertures incompletely extending into the composite laminate. In some embodiments, the method further comprises making outwardly extending surface features on a surface of the composite laminate.

Materials

In one embodiment, the emissive material comprises a phosphor. In view of the present disclosure, the skilled artisan would be able to select the types of phosphors for the emissive phase of the sintered ceramic plate base on several factors, e.g., for the desired white point (i.e., color temperature) by taking the absorption and emission spectra of different types of phosphors into consideration. In some embodiments, the translucent sintered ceramic plate comprises a garnet. The garnet may have a composition $A_3B_5O_{12}$, wherein A and B are independently selected from trivalent metals. In some embodiments, A can be selected from elements including but not limited to: Y, Gd, La, Lu, and Tb; B can be selected from elements including but not limited to: Al, Ga, Si, and In. In some embodiments, the garnet is doped with at least one element preferably a rare earth metal. In some embodiments, the rare earth metal is selected from the group including but not limited to Ce, Gd, La, Tb, Pr, Sm and Eu. Examples of useful phosphors include $Y_3Al_5O_{12}$:Ce, $(Y, Tb)_3Al_5O_{12}$:Ce, and $(Y, Gd)_3(Al, Ga)_5O_{12}$:Ce; in one embodiment, the phosphor material comprises RF thermal plasma synthesized $Y_3Al_5O_{12}$:Ce$^{3+}$ (YAG:Ce). In some embodiments, the phosphor material can be a non-garnet material, e.g., (Sr, Ca, Ba)$_2$SiO$_4$:Eu, Ca$_3$Sc$_2$Si$_3$O$_{12}$:Ce, Ba$_3$MgSi$_2$O$_8$:Eu, BaMgAl$_{10}$O$_{17}$:Eu, La$_2$O$_2$S:Eu, SrGa$_2$S$_4$:Eu, CaAlSiN$_3$:Eu, Ca$_2$Si$_5$N$_8$:Eu, and CaSiAlON:Eu.

In one embodiment, the wavelength-converting ceramic layer comprises an activating or dopant material at a concentration of between 0.050 mol % to about 10.000 mol %. In another embodiment, the wavelength-converting ceramic layer comprises a dopant concentration of between 0.125 mol % to about 5.000 mol %. In another embodiment, the wavelength-converting ceramic layer comprises a dopant concentration of between 0.125 mol % to about 3.000 mol %. In another embodiment, the wavelength-converting ceramic layer comprises a dopant concentration of between 1.000 mol % to about 2.750 mol %, including, but not limited to, 0.100, 0.200, 0.500, 1.000, 1.250, 1.500, 1.750 or 2.000 mol %, or any number between any two of the foregoing numbers.

In one embodiment, a sintering aid can be used such as TEOS, SiO$_2$, Zr, or Mg or Ca silicates and fluorides such as but not limited to tetraethoxysilane (TEOS), colloidal silica and mixtures thereof; oxides and fluorides such as but not limited to lithium oxide, titanium oxide, zirconium oxide, barium oxide, calcium oxide, magnesium oxide, strontium oxide, boron oxide, calcium fluoride, and mixtures thereof; preferably tetraethoxysilane (TEOS).

In one embodiment, dispersants can be used such as Flowlen, fish oil, long chain polymers, stearic acid; oxidized Menhaden fish oil, dicarboxylic acids such succinic acid, ethanedioic acid, propanedioic acid, pentanedioic acid, hexanedioic acid, heptanedioic acid, octanedioic acid, nonanedioic acid, decanedioic acid, o-phthalic acid, p-phthalic acid and mixtures thereof. Other dispersants that may be used include sorbitan monooleate, preferably oxidized Menhaden fish oil (MFO).

In one embodiment, organic binders can be used, which include PVB; Vinyl polymers such as but not limited to polyvinyl butyral, polyvinyl alcohol (PVA), polyvinyl chloride (PVC), polyvinyl acetate (PVAc), polyacrylonitrile, mixtures thereof and copolymers thereof, polyethyleneimine, poly methyl methacrylate (PMMA), vinyl chloride-acetate and mixtures thereof, preferably PVB.

In one embodiment, plasticizers can be used, which include Plasticizers type 1 which can generally decrease the glass transition temperature (Tg), e.g. makes it more flexible, phthalates (n-butyl, dibutyl, dioctyl, butyl benzyl, mixed esters, and dimethyl); and Plasticizers type 2, which can enable more flexible, more deformable layers, and perhaps reduce the amount of voids resulting from lamination, e.g., glycols (polyethylene; polyalkylene; polypropylene; triethylene); dipropylglycol dibenzoate.

In one embodiment, organic binders can be used, which include PVB; Vinyl polymers such as but not limited to polyvinyl butyral, polyvinyl alcohol (PVA), polyvinyl chloride (PVC), polyvinyl acetate (PVAc), polyacrylonitrile, mixtures thereof and copolymers thereof, polyethyleneimine, poly methyl methacrylate (PMMA), vinyl chloride-acetate and mixtures thereof, preferably PVB.

Plasticizers Type 1 plasticizer, which may be employed in manufacture of transparent ceramic materials including but not limited to transparent YAG, includes but is not limited to butyl benzyl phthalate, dicarboxylic/tricarboxylic ester-based plasticizers such as but not limited to phthalate-based plasticizers such as but not limited to bis(2-ethylhexyl)phthalate, diisononyl phthalate, bis(n-butyl)phthalate, butyl benzyl phthalate, diisodecyl phthalate, di-n-octyl phthalate, diisooctyl phthalate, diethyl phthalate, diisobutyl phthalate, di-n-hexyl phthalate and mixtures thereof; adipate-based plasticizers such as but not limited to bis(2-ethylhexyl)adipate, dimethyl adipate, monomethyl adipate, dioctyl adipate and mixtures thereof; sebacate-based plasticizers such as but not limited to dibutyl sebacate, and maleate.

Type 2 plasticizers may include, but not limited to dibutyl maleate, diisobutyl maleate and mixtures thereof, polyalkylene glycols such as but not limited to polyethylene glycol, polypropylene glycol and mixtures thereof. Other plasticizers which may be used include but are not limited to benzoates, epoxidized vegetable oils, sulfonamides such as but not limited to N-ethyl toluene sulfonamide, N-(2-hydroxypropyl) benzene sulfonamide, N-(n-butyl)benzene sulfonamide, organophosphates such as but not limited to tricresyl phosphate, tributyl phosphate, glycols/polyethers such as but not limited to triethylene glycol dihexanoate, tetraethylene glycol diheptanoate and mixtures thereof; alkyl citrates such as but not limited to triethyl citrate, acetyl triethyl citrate, tributyl citrate, acetyl tributyl citrate, trioctyl citrate, acetyl trioctyl citrate, trihexyl citrate, acetyl trihexyl citrate, butyryl trihexyl citrate, trimethyl citrate, alkyl sulphonic acid phenyl ester and mixtures thereof.

Solvents which may be used in manufacture of the emissive and non-emissive layers include, but are not limited to, water, a lower alkanol such as but not limited to ethanol, methanol, isopropyl alcohol, xylenes, cyclohexanone, acetone, toluene and methyl ethyl ketone, and mixtures thereof, preferably a mixture of xylenes and ethanol.

Methods

In another embodiment, as illustrated in FIG. 6, a method of manufacturing an emissive YAG:Ce composite laminate is described which comprises the steps of providing a cast tape formed of non-emissive material, providing a cast tape formed of an emissive material, stacking portions of the cast tapes to produce a assembly, compressing the assembly to produce a perform, heating the preform to produce a green preform, and sintering the green preform to produce an emissive YAG:Ce composite laminate. In another embodiment, the emissive material provided has a wavelength conversion efficiency of at least about 0.650. In some embodiments, the step of providing the cast tape comprises performing flow-based thermochemical synthesis of non-stoichiometrically correct phosphor nanoparticles, In another embodiment, the emissive material provided is converted to a material having a wavelength conversion efficiency of at least about 0.650 during the method of manufacture, e.g. by the sintering step. In another embodiment, the step of providing a cast tape formed of an emissive material further comprises providing scattering centers therein.

In one embodiment, the step of providing at least one cast dried tape formed of a non-emissive material comprises the steps of mixing about 3 molar parts $Y_2O_3$: 5 molar parts $Al_2O_3$, dispersant, sintering aid, and organic solvent, milling the mixture using a milling ball of a material different than Y or Al material to produce a milled first slurry, mixing type 1 and type 2 plasticizers and organic binder into said first slurry to produce a second slurry; milling the second slurry to produce a milled second slurry to produce a non-emissive cast tape, tape casting the milled second slurry to produce a non-emissive cast tape, and drying the non-emissive containing cast tape to produce a non-emissive dried tape. The step of tape casting can include heating and compressing plural layers of dried tape to form a laminated green sheet, heating the laminated green sheet to remove organic components, and sintering the green sheet to form transparent or translucent non-emissive ceramic sheets.

In one embodiment, the step of providing a dried cast tape formed of an emissive material includes the steps of (i) synthesizing stoichiometrically correct phosphor nanoparticles using a flow-based thermochemical method, the phosphor nanoparticle having a particle size of between 30 nm and about 500 nm; (ii) pre-annealing the phosphor nanoparticles at a temperature sufficient to substantially convert the nanoparticles to substantially or nearly all garnet phase phosphor nanoparticles; (iii) mixing the pre-annealed phosphor nanoparticles, dispersant, sintering aid, and organic solvent; (iv) ball milling the mixture using a milling ball of a material which does not contain yttrium or aluminum to produce a milled first slurry; (v) mixing a type 1 and type 2 plasticizer and organic binder into said first slurry to produce a second slurry; (vi) milling the second slurry to produce a milled second slurry; (vii) tape casting the milled second slurry to produce a cast tape formed of an emissive material having a wavelength conversion efficiency of at least about 0.650, which material is derived from the garnet phase phosphor nanoparticles; (viii) drying the emissive material-containing cast tape to produce an emissive dried tape; (ix) heating and compressing a plurality of dried tapes to form a laminated green sheet; (x) heating the laminated green sheet to remove organic components, and (xi) sintering the green sheet to form transparent or translucent emissive ceramic sheets. In another embodiment, the flow-based thermochemical synthesis method includes RF thermal plasma synthesis of the above-mentioned nanoparticles. In some embodiments, an emissive layer comprising an emissive material and a scattering material can be prepared in the same manner by synthesizing non-stoichiometrically correct phosphor nanoparticles using a flow-based thermochemical method, the phosphor nanoparticle having a particle size of between 30 nm and about 500 nm. In some embodiments, an emissive layer comprising an emissive material and a scattering material can be prepared in the same manner by synthesizing stoichiometrically correct phosphor nanoparticles using a flow-based thermochemical method, the phosphor nanoparticle having a particle size of between 30 nm and about 500 nm, and adding additional second phase material.

In some embodiments, the nanoparticles have a particle size between 30 nm and about 5 μm. In another embodiment, the particle size is between 30 nm and 1 μm. In still another embodiment, the particle size is between 30 μm and 500 nm. In another embodiment, the particle size may be any size between any two of the foregoing numbers.

Preannealing/Particle Size Adjustment

In one embodiment, the nanoparticles are preannealed to substantially convert the nanoparticles to substantially or nearly all garnet phase phosphor nanoparticles with attendant increase in particle size. Substantially or nearly all garnet phosphor nanoparticles refers to at least 90%, at least 95%, at least 97% and at least 99% of the nanoparticles being in the garnet phase in embodiments, or the degree functionally equivalent to all of the garnet phosphor nanoparticles for the intended purposes. Substantially or nearly all garnet phase can be discerned by comparison of XRD spectra with known standards. Raw material particles for tape casting in some cases are in the nanometer range. In order to reduce cracking of cast tapes caused by capillary force during evaporation of solvents, particle size of both $Y_2O_3$ and $Al_2O_3$ can be matched with each other and selected to be in the appropriate range. The particle size of yttrium aluminum garnet (YAG), or $Y_2O_3$ and $Al_2O_3$ can be adjusted by pre-annealing the particles in a vacuum in an ambient including but not limited to $O_2$, $H_2$, $H_2/N_2$ and/or air in the temperature range of 800° C. to 1800° C., preferably in the range of 900° C. to 1500 C, more preferably in the range of 1000° C. to 1400° C. Annealed particles have a BET surface area in the range of 0.5 to 20 $m^2/g$, preferably in the range of 1-10 $m^2/g$, more preferably in the range of 3 to 6 $m^2/g$.

Slurry Making (Mixing Milling)

In some embodiments, the method includes the steps of mixing the pre-annealed phosphor nano-particles, dispersant, sintering aid, and organic solvent, ball milling the mixture using a milling ball of a material which is different from the non-oxide element of the nano-particles, e.g., does not contain yttrium or aluminum, to produce a milled first slurry, mixing a type 1 and type 2 plasticizer and organic binder into said first slurry to produce a second slurry; milling the second slurry to produce a milled second slurry. In some embodiments the method includes the steps of mixing additional second phase materials to or with the pre-annealed phosphor nano-particles.

Described herein as an example is a method to make slurry for fabricating yttrium aluminum garnet (YAG) green sheets by tape casting. Particles of YAG synthesized by plasma containing activators such as, but not limited to, trivalent cerium ions, or a mixture of $Y_2O_3$ and $Al_2O_3$ based on stoichiometry, are mixed with dispersant, activators, sintering aids and solvents, subsequently, mixed by ball milling for 0.5 to 100 hrs, preferably 6 to 48 hrs, more preferably 12 to 24 hrs. This ball milled slurry is mixed with a polymeric binder such as but not limited to poly(vinyl butyral-co-vinyl alcohol-co-vinyl acetate) (PVK), plasticizers such as but not limited to benzyl n-butyl phthalate (BBP) and polyethylene glycol (PEG). The average molecular weight of PEG is preferably in the range of 100 to 50000, more preferably in the range of 400 to 4000. Binders and plasticizers can be either directly added and mixed with slurry or be dissolved in advance in solvent then added to slurry.

The mixture can be ball milled for 0.5 to 100 hrs, preferably 6 to 48 hrs, more preferably 12 to 24 hrs. The milling balls are, in one embodiment, comprised of material different from components of the host material, e.g., if the host material is YAG, then the ball material can comprise $ZrO_2$. The slurry is passed through a filter to separate the ball and slurry. Viscosity of the slurry is adjusted in the range of 10 to 5000 centipoise (cP), preferably in the range of 100 to 3000 cP, more preferably in the range of 400 to 1000 centipoise (cP).

Tape Casting

In some embodiments, the method includes the step of tape casting the milled second slurry to produce a cast tape formed of an emissive material having a wavelength conversion efficiency of at least about 0.650.

Described herein as an example is a method of tape casting. Slurry with appropriate viscosity is casted on a releasing substrate, for example, a silicone coated Mylar® (Polyethelene tetraphthalate) substrate, with a doctor blade with an adjustable gap. Thickness of cast tape can be adjusted by changing the doctor blade gap, slurry viscosity and casting rate. The cast tape is dried at ambient atmosphere with or without heating of the substrate. Green sheets with various thicknesses are obtained after evaporation of solvent from the cast tape. The gap of doctor blade can be changed in the range of 0.125 to 1.25 mm, preferably in the range of 0.25 to 1.00 mm, more preferably in the range of 0.375 to 0.75 mm. The casting rate is preferably in the range of about 10 to about 150 cm/min, preferably in the range of 30 to 100 cm/min, and still more preferably in the range of 40 to 60 cm/min. In this way, the thickness of green sheets can be adjusted in the range of 20 to 300 micrometers. A person skilled in the art will be able to choose an appropriate set of parameters to obtain a particular green sheet thickness without going beyond the scope of the disclosed embodiments.

Lamination

In one embodiment, the method includes the steps of heating and compressing a plurality of dried tapes to form a laminated green sheet.

Figure 14:
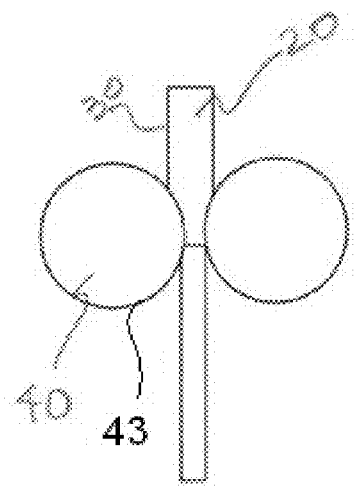
FIG. 14 illustrates an embodiment of one of the processes used for fabricating a disclosed embodiment.
Figure 15:
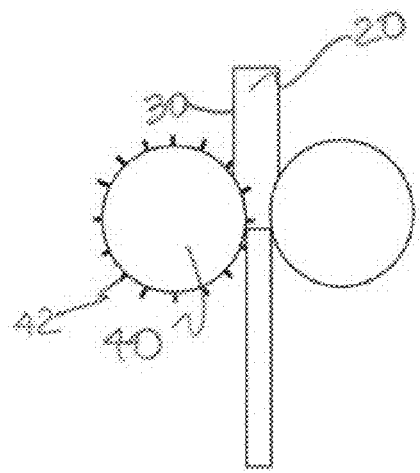
FIG. 15 illustrates another embodiment of one of the processes used for fabricating a disclosed embodiment.

Described herein as an example is a method to produce a composite of emissive and non-emissive green sheets by lamination. Cast tapes comprising emissive and non-emissive materials are cut into desired shape and dimension, and then assembled by stacking the single green sheet together. The total number of green sheets in stacking can be in the range of 2 to 100 depending on the thickness of single green sheet, activator concentration in emissive layer and desired thickness of composite after final firing. Stacking of cast tapes is placed in between metal dies, which are made of metals such as stainless steel, etc. The surface of metal dies in contact with laminated green sheets can be polished to be mirror-like for easy peel off. Cast tape stacking is heated to above the Tg temperature of binders and then compressed uniaxially at a pressure in the range of 1 to 500 MPa (Mega Pascals), preferably 30 to 60 MPa. Pressure and heat applied to the green sheet stacking are held for 1 to 60 min, preferably 30 min. Thereafter the pressure is released. In a further aspect, patterns in green sheets include but are not limited to straight through or blind holes which completely extend therethrough from one surface to the other surface or partially extend into but not completely through the green sheets. Tapered holes are formed on the green sheets by using dies with designed patterns during or following lamination as illustrated in FIG. 15 wherein the green sheet 20 having a surface 30 passes through die rollers 40, one of which has protrusions 42 for forming concave structures of interest on the surface 30, while accomplishing lamination of the green sheet 20. Surface roughness enhancing patterns including but not limited to outwardly extending pillars, pyramids or other repeating or non-repeating extension or protrusions, can also be formed on the green sheets by using dies with designed patterns during or following lamination as illustrated in FIG. 14 wherein the green sheet 20 having a surface 30 passes through die rollers 40, one of which has surface roughness enhancing patterns 43 to be formed on the surface 30, while accomplishing lamination of the green sheet 20. Such patterns can improve the light coupling and extraction in the desired direction of light output by waveguide effects and by reducing lateral light propagation.

Firing

In some embodiment, the method includes the steps of heating the laminated green sheet to remove organic components and sintering the green sheets to form transparent or translucent emissive ceramic sheets. The term "transparent" or "translucent" refers to the laminate having a total transmittance of at least about 40%, at least about 50%, at least about 60%, at least about 70%, at least about 80% or at least about 90%, measured at 800 nm in embodiments or the laminate through which light in use passes for the intended purposes, regardless of the color of the laminate.

Described herein as an example is a method of sintering a laminated green sheet to obtain a dense ceramic sheet. First, laminated green sheets are sandwiched between cover plates made of $ZrO_2$ (not limited to $ZrO_2$) with about 40% porosity to reduce the warping, cambering and bending of the green sheet during debindering and sintering. Debindering refers to the removal of organic binders and solvents by heating at appropriate temperatures in embodiments. A plurality of green sheets can be stacked between porous $ZrO_2$ cover plates alternatively. The materials of the cover sheets can be selected to comprise materials substantially different from the material of the green sheets, e.g., does not contain the same metal elements as the metal oxides of the green sheet and is able to withstand and retain the same state, phase, or configuration as that of the green sheet at the processing temperatures. The green sheets are heated in air to decompose the organic components such as binders, plasticizers. The green sheets are heated to a temperature in the range of 300° C. to 1000° C., preferably 500° C. to 800° C., more preferably 600° C. at rate of 0.01 to 10° C./min, preferably 0.01 to 5° C./min, more preferably 1.5 to 1.0° C./min and held at the highest temperature for 30 to 300 min depending on the thickness of laminated green sheets.

After debindering, the green sheets are sintered in a vacuum, $H_2/N_2$, $H_2$, and/or $Ar/H_2$ at a temperature ranging from 1200° C. to 1900° C., preferably 1500° C. to 1800° C., more preferably 1600° C. to 1700° C. for duration from 1 hr to 100 hrs, preferably 2 to 10 hrs. The debindering and sintering can be carried out separately or performed together, subject to desired atmospheric conditions. The laminated green sheets sintered in reducing atmosphere are usually brownish or dark brown in color due to the formation of defects such as oxygen vacancy, etc. during sintering. Re-oxidation in air or oxygen atmosphere is usually necessary to render the ceramic sheet high transparent in the visible light wavelength range. The re-oxidation is conducted in a temperature range of 1000° C. to 1500° C. for 30 to 300 min at a heating rate of 1 to 20° C./min, preferably 1400° C. for 2 hrs at 5° C./min.

Modifying the Surface of the Laminated Composite

In other embodiments, the method can optionally further include the step of defining apertures or texturing the surfaces of the laminate composite, preferably the distal surface of the composite laminate. As shown in FIGS. 14 and 15, one of the rollers 40 has a repeating or patterned contacting surface 42 (FIG. 15) or 43 (FIG. 14) and is contacted with the surface 30 of the laminated composite 20.

Evaluation Method for Internal Quantum Efficiency (IQE) of Powder

The luminescence efficiency of phosphor powder can be evaluated as Internal Quantum Efficiency (IQE) by measuring the emission from the phosphor powder under irradiation of standard excitation light with predetermined intensity. This powder IQE value can provide a very useful indication of the efficiency of the wavelength-converting layer. The internal quantum efficiency (IQE) of a phosphor is the ratio of the number of photons generated from the phosphor to the number of photons of excitation light which are actually absorbed by the phosphor.

The IQE of a phosphor material can be expressed by the following formula:

$$\text{Internal Quantum Efficiency} = \frac{\int \lambda \cdot P(\lambda) d\lambda}{\int \lambda \cdot [E(\lambda) - R(\lambda)] d\lambda}$$

where at a wavelength of interest λ, E(λ) is the number of photons in the excitation spectrum that are incident on the phosphor, R(λ) is the number of photons in the spectrum of the reflected excitation light, and P(λ) is the number of photons in the emission spectrum of the phosphor. This method of IQE measurement is also provided in Ohkubo et al., "Absolute Fluorescent Quantum Efficiency of NBS Phosphor Standard Samples," 87-93, J. Illum Eng Inst. Jpn. Vol. 83, No. 2, 1999, the disclosure of which is incorporated herein by reference in its entirety. This method assumes that all the excitation light that is not reflected is completely absorbed by the phosphor.

Evaluation Method for Wavelength Conversion Efficiency (WCE) of the Composite Laminate The luminescence efficiency of a composite laminate comprising a phosphor ceramic layer can also be evaluated as Wavelength Conversion Efficiency (WCE) by measuring the photoluminescence emitted from the composite laminate or phosphor layer upon irradiation with excitation light of predetermined intensity.

The WCE of the composite or phosphor layer can be expressed by the following formula:

$$\text{Wavelength Conversion Efficiency} = \frac{\phi_e(Emi)}{\phi_e(Exc)} = \frac{\int P_{Emi}(\lambda) \cdot d\lambda}{\int P_{Exc}(\lambda) \cdot d\lambda}$$

where at any wavelength λ, $P_{Exc}(\lambda)$ is the radiation power of the excitation spectrum that is incident on the composite laminate or phosphor layer, and $P_{Emi}(\lambda)$ is the radiation power in the combined spectrum of emission from the composite laminate or phosphor ceramic layer and the excitation light.

In the present disclosure where conditions and/or structures are not specified, the skilled artisan in the art can readily provide such conditions and/or structures, in view of the present disclosure, as a matter of routine experimentation. Also, in the present disclosure, the numerical numbers applied in specific embodiments can be modified by a range of at least ±50% in other embodiments, and the ranges applied in embodiments may include or exclude the endpoints.

EXAMPLES

IQE Measurement and Comparison of Powders

The present invention will be explained in detail with reference to Examples which are not intended to limit the present invention.

1. Powder Synthesis 1.1 Plasma-Generated YAG:Ce Powder Synthesis 56.50 g of Yttrium (III) nitrate hexahydrate (99.9% pure, Sigma-Aldrich), 94.92 g of Aluminum nitrate nonahydrate (>98% pure, Sigma-Aldrich), and 1.14 g of Cerium (III) nitrate hexahydrate (99.99% pure, Sigma-Aldrich) were dissolved in deionized water, followed by ultrasonication for 30 min to prepare a substantially transparent solution.

This precursor solution of 2.0M concentration was carried into a plasma reaction chamber similar to that shown in patent publication WO2008/112710 via an atomization probe using a liquid pump. The principle, technique and scope taught in the patent publication WO2008/112710 is hereby incorporated by reference in its entirety.

The synthesis experiment was conducted with a RF induction plasma torch (TEKNA Plasma System, Inc PL-35, Sherbrooke, Quebec, CAN) being supplied with power from a Lepel RF Power Supply (Lepel Corp., Edgewood, N.Y., USA) operating at 3.3 MHz. For the synthesis experiments, the chamber pressure was kept around 25 kPa-75 kPa, and the RF generator plate power was in the range of 10-30 kW. Both the plate power and the chamber pressure are user-controlled parameters. Argon was introduced into the plasma torch as both a swirling sheath gas (20-100 slm) and a central plasma gas (10-40 slm). Sheath gas flow was supplemented by addition of hydrogen (1-10 slm). Reactant injection was performed using a radial atomization probe (TEKNA Plasma System, Inc SDR-792-230) which operates on the principle of two-fluid atomization. The probe was positioned at the center of the plasma torch during reactant injection. The reactants were fed into the plasma by in-situ atomization at a liquid delivery rate of 1-50 ml/min during synthesis. Atomization of the liquid reactant was performed with Argon as atomizing gas delivered at a flow rate of 1-30 slm. The reactants upon passing through the hot zone of the RF thermal plasma underwent a combination of evaporation, decomposition and nucleation. The nucleated particles were collected from the flow stream onto suitable porous ceramic or glass filters. The particles synthesized in this section had an average particle size of about 300 nm, to about 600 nm and the particles were constituted by Ce-doped YAG powder with a cerium content of 1.75 mol %.

1.2 YAG:Ce Powder Synthesis Via Solid State Reaction 3.9142 g of $Y_2O_3$ powder (99.99%, Nippon Yttrium Company Ltd.), 2.998 g of $Al_2O_3$ powder (99.99%, grade AKP-30, Sumitomo Chemicals Company Ltd.) and 0.1341 g of Cerium (III) nitrate hexahydrate (99.99% pure, Sigma-Aldrich) were added to ball mill jars. The ratio of $Al_2O_3$, $Y_2O_3$ and Cerium (III) nitrate hexahydrate was maintained at the stoichiometric ratio of 2.94:5:0.06. A slurry was produced by mixing $Y_2O_3$ powders, $Al_2O_3$ powders, Cerium (III) nitrate hexahydrate and methanol by ball milling for 24 hours. This slurry was dried in an agate mortar at 70° C. until methanol was completely evaporated. The dried mixture of powders was annealed in air or a mixture of 3% H2/97% N2 at 1400 degrees C. for 10 hours.

The particles synthesized in this section had an average particle size of 0.2 to 0.5 μm, and the particles were constituted by Ce-doped YAG powder with a cerium content of 1.75 mol %

1.3 Co-Precipitation Method Generated YAG:Ce Powder Synthesis 3.537 mol $YCl_3$ (99.9% purity, VWR) and 0.063 mol $CeCl_3$ (99.9% purity, Aldrich) were accurately weighed inside a glove box under nitrogen atmosphere to reduce measuring errors that occur in the stoichiometric mixing (due to moisture absorption) to the ratio e.g., of Y:Ce of 1.75% in the final Ce-doped yttrium aluminum garnet (YAG:Ce) particles. A tiny amount of both chloride powders were slowly added to 3.6 L de-ionized water at a time with constant stirring in order to avoid instant water boiling caused by violent hydrolysis. 6.0 mol $AlCl_3$ (>99.9% purity, Aldrich) was also accurately weighed inside a glove box under nitrogen atmosphere and it was dissolved into the separate 6.0 L de-ionized water in the same manner as described above for the Y and Ce precursors. These two aqueous solutions were then mixed in a 40 L Erlenmeyer flask with constant stirring. The two containers for the $YCl_3/CeCl_3$ and for the $AlCl_3$ solutions were rinsed thoroughly with de-ionized water and the rinsing water was combined into the 40 L flask to ensure quantitative transfer and mixing of the metal chlorides solution. 0.4 L of 36N concentrated sulfuric acid ($H_2SO_4$, 95-98% purity, Aldrich) was then slowly added to the mixed solution to form the yttrium-aluminum-cerium stock solution with constant stirring. Afterwards, approximately 12 L of saturated aqueous solution of ammonium bicarbonate ($NH_4HCO_3$, 99% purity, Aldrich) was added drop-wise into the stock solution until the pH of the solution became 4.8 as measured by an electronic pH meter. This resulting solution containing white precipitates was continuously stirred overnight at room temperature. Then ammonium hydroxide solution ($NH_4OH$, 29-30% as $NH_3$, Aldrich) was added drop-wise into the mixed solution until pH became 7.8, and the resulting solution was stirred for an additional 2 hours. Finally, the solution was filtered to collect a white solid using vacuum filtration. The collected white solid was repeatedly washed with de-ionized water 6 times using vacuum filtration. The washed white solid was dried at 120° C. for 48 hours to obtain YAG:Ce precursor particles.

The particles synthesized in this section had an average particle size of 0.1-0.2 μm, and the particles were constituted by Ce-doped YAG powder with a cerium content of 1.75 mol %.

1.4 Sintering the Powders for IQE Measurement

The phosphor particles synthesized in each of sections 1.1 to 1.3 above (5 gram) were separately annealed in a tube furnace (MTI GSL 1600) at 1500° C. for 5 hrs in a flowing gas mixture of 3% $H_2$ and 97% $N_2$ in high purity alumina combustion boats.

1.5 IQE Measurement Results of Phosphor Powder

IQE measurements were performed with an Otsuka Electronics MCPD 7000 multi channel photo detector system (Osaka, JPN) together with required optical components such as integrating spheres, light sources, monochromator, optical fibers, and sample holder as described below.

Obtained phosphor powders were tabletized to a square shape of area 15 mm×15 mm with about 1 mm thickness. The tabletized YAG:Ce samples were irradiated with a Xe lamp (150 W, Otsuka Electronics L2274) at 450 nm after passing through a monochromator. The emission spectrum was acquired by placing the sample in an integrating sphere. Next, a diffuse reflectance standard (Labsphere, Spectalon®) with 50% of reflectance was placed in the integrating sphere as reference. The spectrum of excitation light (450 nm) was then acquired. Continuous spectrum light from a halogen lamp source (150 W, Otsuka Electronics MC2563) was used for irradiation of the tablet, followed by acquisition of the reflectance spectrum. The 50% diffuse reflectance standard was again used as a reference for the reflectance spectrum measurement.

IQE was calculated from the data obtained based on the IQE equation set forth above. The IQE of the powder samples was determined to be 79.8% (plasma-generated YAG), 69.2% (solid state reaction), and 39.7% (co-precipitation method generated YAG) as shown in FIG. 8. It was clear that RF plasma synthesized phosphors have the highest internal quantum efficiency compared to other methods.

2 Ceramic Tablet WCE Measurement and Comparison 2.1 Ceramic Tablet of Plasma Synthesized Powder In a manner similar to that described in section 1.1, plasma synthesized yttrium aluminum garnet (YAG) powder (5 g) containing 0.125 to 0.20 mol % cerium with respect to yttrium was obtained and added to a high purity alumina combustion boat and annealed in a tube furnace (MTI GSL 1600) at 1200° C. for 2 hrs in a flowing gas mixture of 3% $H_2$ and 97% $N_2$. BET surface area of annealed YAG:Ce powders was measured to be about 5.5 $m^2/g$.

The annealed plasma synthesized yttrium aluminum garnet (YAG) powder (5 g) was added to high purity alumina ball mill jars containing 15 g of $ZrO_2$ balls of 3 mm in diameter. Poly(vinyl butyral-co-vinyl alcohol-co-vinyl acetate) (0.25 g) and tetraethoxysilane (TEOS) (0.2 g) were added to the ball mill jar together with ethanol (20 ml). The mixture was ball-milled for 4 hrs to produce a slurry followed by drying in an agate mortar at 70° C. until the ethanol evaporated completely.

2.2 Ceramic Tablet of Solid State (SSR) Synthesized Powder $Y_2O_3$ powder (2.8428 g, 99.99%, Nippon Yttrium Company Ltd.) and $Al_2O_3$ (2.1414 g, 99.99%, grade AKP-30, Sumitomo Chemicals Company Ltd.) were added to a high purity alumina ball mill jar containing 15 g of $ZrO_2$ balls of 3 mm diameter. $Ce(NO_3)_3.6H_2O$ (0.0109 g, 99.99% pure, Sigma-Aldrich) i.e. 0.2 mol % cerium with respect to yttrium was added to the same jar. Poly(vinyl butyral-co-vinyl alcohol-co-vinyl acetate) (0.25 g), and tetraethoxysilane (0.2 g), and ethanol (20 ml) were added to the ball mill jar at the same time. The mixture was ball-milled and dried in the same way as mentioned above. The powder mixture of Y—Al—Ce for reaction sintering was thus produced.

2.3 Ceramic Tablet of Powder Made by Co-Precipitation (Wet Solution)

In a manner similar to that described in section 1.3 above, co-precipitation synthesized yttrium aluminum garnet powder (5 g) containing 0.175 mol % cerium with respect to yttrium was obtained and added to a high purity alumina combustion boat and annealed in a tube furnace (MTI GSL 1600) at 1250° C. for 2 hrs in a flowing gas mixture of 3% $H_2$ and 97% $N_2$. BET surface area of annealed YAG powders was measured to be about 5.7 $m^2/g$. The annealed co-precipitation synthesized yttrium aluminum garnet (YAG) powder (5 g) was added to a high purity alumina ball mill jar containing 15 g of $ZrO_2$ balls of 3 mm in diameter. Poly(vinyl butyral-co-vinyl alcohol-co-vinyl acetate) (0.25 g) and tetraethoxysilane (0.2 g) were added to the ball mill jar together with ethanol (20 ml). The mixture was ball-milled for 4 hrs to produce a slurry followed by drying in an agate mortar at 70° C. until the ethanol evaporated completely.

2.4 Ceramic Tablet WCE Comparisons

Four different tablets using 80 mg, 100 mg, 120 mg, and 140 mg of plasma YAG:Ce powder after undergoing the processing described in section 2.1, were prepared by using metal dies of 13 mm diameter and pressing under a uniaxial force of 5 metric tons in a hydraulic press. Similarly, powder mixtures of Y—Al—Ce for reaction sintering and co-precipitation generated YAG:Ce powder prepared in sections 2.2 and 2.3, respectively, were used for preparing four tablets each using similar amounts of powder to those indicated above for the plasma YAG:Ce powder. Using different quantities of the starting powder resulted in various different tablet thicknesses after pressing. For debindering, preformed tablets were heated at a ramp rate of 1° C./min in a box furnace to 800° C. and held for 2 hrs in air to remove organic components. Following debindering, preform tablets were sintered in a vacuum of $10^{-3}$ Torr at 1550° C. for 5 hrs at a heating rate of 5° C./min and cooling rate of 10° C./min to room temperature. The obtained brownish sintered ceramic sheets were reannealed in a tube furnace in vacuum at 1400° C. for 2 hrs at heating and cooling rates of 10° C./min and 20° C./min respectively.

The transmittances of the obtained sintered YAG plates were measured by high sensitivity multi channel photo detector (MCPD 7000, Otsuka Electronics, Inc). First, a glass plate was irradiated with continuous spectrum light from a halogen lamp source (150 W, Otsuka Electronics MC2563) to obtain reference transmission data. Next, each YAG ceramic plate was placed on the reference glass and irradiated. The transmission spectrum was acquired by the photo detector (MCPD) for each sample. In this measurement, the YAG plate on the glass plate was coated with paraffin oil having the same refractive index as the glass plate. Transmittance at 800 nm wavelength of light was used as a quantitative measure of transparency of the YAG ceramics plates.

After each phosphor plate was diced into 2 mm×2 mm using a dicer (MTI, EC400), two WCE measurements were performed for each of the four plates with Otsuka Electronics MCPD 7000 multi channel photo detector system together with required optical components such as optical fibers (Otsuka Electronics), 12-inch diameter integrating spheres (Gamma Scientific, GS0IS12-TLS), calibration light source (Gamma Scientific, GS-IS12-OP1) configured for total flux measurement, and excitation light source (Cree blue LED chip, dominant wavelength 455 nm, C455EZ1000-S2001).

Blue LED with peak wavelength of 455 nm was placed at the central position of the integrating sphere and was operated with a drive current of 25 mA. First the radiation power from the bare blue LED chip as excitation light was acquired. Next, a diced phosphor layer coated with paraffin oil having similar refractive index as common encapsulation resin such as epoxy was mounted on the LED chip. Then the radiation powder of the combination of the YAG phosphor layer and the blue LED was acquired.

WCE was calculated from the data obtained based on the WCE equation set forth above. The wavelength conversion efficiency for transparent or translucent ceramic tablets formed from plasma YAG:Ce, co-precipitation generated YAG:Ce, and reaction sintered (solid state reaction) YAG:Ce were measured over various levels of plate transmission (depending on the method of preparation and the thickness of plates), e.g., 5% to about 95% transmission. The results are set forth in FIG. 9 (the WCE values slightly fluctuate predominantly due to production errors, not measuring errors). Most ceramic tablets formed from the plasma YAG:Ce had wavelength conversion efficiencies (WCE) of greater than 0.650, as compared to at most 0.625 from the ceramic tablet from reaction sintering of $Y_2O_3$ and $Al_2O_3$ powders with Ce, and less than 0.200 from the YAG:Ce made from the co-precipitation generated powder. Some ceramic tables formed from the plasma YAG:Ce showed a WCE of lower than 0.650, and, while not wanting to be limited by theory, it is believe that this was because the homogeneity of Ce dispersion is greater (heterogeneity is less) in the plasma generated material than in the SSR or co-precipitation generated material. It is believed that by at least controlling the heterogeneity of dopant dispersion within the wavelength-converting layer as an operation variable, ceramic tablets having a WCE of at least 0.650 in the form of film can constantly be obtained from plasma YAG:Ce. In some embodiments, as shown in FIG. 9, a light emissive layer has a WCE of at least 0.650 and a transmittance of 50% to 80% (as measured for 800-nm light) and is constituted by plasma YAG:Ce which is substantially or nearly the only light emissive material included therein.

3 Laminated Composite Emissive Layers 3.1 Non-Emissive Layers for Laminated Composite A 50 ml high purity $Al_2O_3$ ball mill jar was filled with 55 g of $Y_2O_3$-stabilized $ZrO_2$ ball of 3 mm diameter. Then, in a 20 ml glass vial, 0.153 g dispersant (Flowlen G-700. Kyoeisha), 2 ml xylene (Fisher Scientific, Laboratory grade) and 2 ml ethanol (Fisher Scientific, reagent alcohol) were mixed until the dispersant was dissolved completely. The dispersant solution and tetraethoxysilane as sintering aid (0.038 g, Fluka) were added to a ball mill jar.

$Y_2O_3$ powder (3.984 g, 99.99%, lot N-YT4CP, Nippon Yttrium Company Ltd.) with a BET surface area of 4.6 $m^2/g$ and $Al_2O_3$ powder (2.998 g, 99.99%, grade AKP-30, Sumitomo Chemicals Company Ltd.) with a BET surface area of 6.6 m²/g were added to ball mill jar. The total powder weight was 7.0 g and the ratio of $Y_2O_3$ to $Al_2O_3$ was at a stoichiometric ratio of 3:5. A first slurry was produced by mixing the $Y_2O_3$ powder, the $Al_2O_3$ powder, dispersant, tetraethoxysilane, xylenes, and ethanol by ball milling for 24 hours.

A solution of binder and plasticizers was prepared by dissolving 3.5 g poly(vinyl butyral-co-vinyl alcohol-co-vinyl acetate) (Aldrich), 1.8 g benzyl n-butyl phthalate (98%, Alfa Aesar), and 1.8 g polyethylene glycol (Mn=400, Aldrich) in 12 ml xylene (Fisher Scientific, Laboratory grade) and 12 ml ethanol (Fisher Scientific, reagent alcohol). A second slurry was produced by adding 4 g of the binder solution into the first slurry and then milling for another 24 hours. When ball milling was complete, the second slurry was passed through a syringe-aided metal screen filter with pore size of 0.05 mm. Viscosity of second slurry was adjusted to 400 centipoise (cP) by evaporating solvents in the slurry while stirring at room temperature. The slurry was then cast on a releasing substrate, e.g., silicone coated Mylar® carrier substrate (Tape Casting Warehouse) with an adjustable film applicator (Paul N. Gardner Company, Inc.) at a cast rate of 30 cm/min. The blade gap on the film applicator was set at 0.508 mm (20 mil). The cast tape was dried overnight at ambient atmosphere to produce a green sheet of about 140 μm thickness.

3.2 Emissive Layers
3.2.1 Plasma Laminate

Plasma-produced yttrium aluminum oxide (with stoichiometry Y:Al:O=3:5:12) powders (5.2 g) containing 2 mol % cerium with respect to yttrium with a BET surface area of about 20 m²/g was added to a high purity alumina combustion boat followed by annealing in a tube furnace (MTI GSL-1600) at heating ramp of 3-5° C./min to 1250° C. in air or 3% $H_2$/97% $N_2$ for 2 hrs. Then, it was cooled down to room temperature at a ramp of 5° C./min. Yellow color powder with a BET surface area of 4.6 m²/g was obtained after annealing.

A 50 ml high purity $Al_2O_3$ ball mill jar was filled with 24 g $Y_2O_3$ stabilized $ZrO_2$ ball of 3 mm diameter. Then, in a 20 ml glass vial, 0.084 g dispersant (Flowlen G-700. Kyoeisha), 2 ml xylene (Fisher Scientific, Laboratory grade), and 2 ml ethanol (Fisher Scientific, reagent alcohol) were mixed until the dispersant was dissolved completely. The dispersant solution and tetraethoxysilane as a sintering aid (0.045 g 99.0% pure, Fluka) were added to a ball mill jar. The annealed plasma YAG powder (3.0 g) with a BET surface area of 4.6 m²/g, was added to a ball mill jar. The first slurry was produced by mixing the YAG powder, dispersant, tetraethoxysilane, xylenes, and ethanol by ball milling for 24 hours.

A solution of binder and plasticizers was prepared by dissolving 5.25 g poly(vinyl butyral-co-vinyl alcohol-co-vinyl acetate) (Aldrich), 2.6 g benzyl n-butyl phthalate (98%, Alfa Aesar), and 2.6 g polyethylene glycol (Mn=400, Aldrich) in 18 ml xylene (Fisher Scientific, Laboratory grade) and 18 ml ethanol (Fisher Scientific, reagent alcohol). A second slurry was produced by adding 1.2 g of the binder solution into the first slurry and then milling another 24 hours. When ball milling was complete, the second slurry was passed through a syringe-aided metal screen filter with pore size of 0.05 mm. The viscosity of the second slurry was adjusted to 400 centipoise (cP) by evaporating solvents in the slurry while being stirred at room temperature. The slurry was then cast on a releasing substrate, e.g., silicone coated Mylar® carrier substrate (Tape Casting Warehouse) with an adjustable film applicator (Paul N. Gardner Company, Inc.) at a cast rate of 30 cm/min. The blade gap on the film applicator was set at 0.254 mm (10 mil). The cast tape was dried overnight at ambient atmosphere to produce a yellow-colored green sheet of about 35 μm thickness.

3.3 Example: Laminate Composite

The dried cast tape of the non-emissive (e.g., non-doped) material (95 μm or 140 μm an thickness) comprising $Y_2O_3$ and $Al_2O_3$ powders as well as the dried cast tape comprising the annealed plasma YAG:Ce powders (65 μm or 35 μm thickness) or annealed SSR powders (3 pieces having total thickness of about 290 μm) were cut into circular shape of 13 mm diameter with a metal puncher. Varying the numbers of the punched circular-shaped undoped, non-emissive tape pieces and that of the emissive cast tape pieces, several laminate composites were constituted as set forth in Table 1.

TABLE 1

| Sample | Emissive layer | Non-emissive |
|---|---|---|
| [3-1] | 1 × (35 μm) | 3 × (140 μm) |
| A (3-1-3) | 1 × (65 μm) | 3 × (95 μm) |
| B (3-2-3) | 2 × (65 μm) | 3 × (95 μm) |
| C (2-3-2) | 3 × (65 μm) | 2 × (95 μm) |
| D (2-4-2) | 4 × (65 μm) | 2 × (95 μm) |
| E (2-5-2) | 5 × (65 μm) | 2 × (95 μm) |

In Table 1, [3-1] refers to a lamination of three non-emissive layers and one emissive layer; A (3-1-3) refers to a lamination of three non-emissive layers, one emissive layer, and three non-emissive layers. B to E refer to laminations defined in a similar manner to A.

The respective pieces of punched circular-shaped undoped tape and plasma YAG:Ce cast tape were placed between circular dies with mirror-polished surfaces and heated on a hot plate to 80° C., followed by compression in a hydraulic press at a uniaxial pressure of 5 metric tons and held at that pressure for 5 minutes. Laminated composites of emissive and non-emissive layers were thus produced, which exhibited yellow and white color on the emissive and non-emissive sides respectively.

For debindering, laminated green sheets were sandwiched between $ZrO_2$ cover plates (1 mm in thickness, grade 42510-X, ESL Electroscience Inc.) and placed on an $Al_2O_3$ plate of 5 mm thick; then heated in a tube furnace in air at a ramp rate of 0.5° C./min to 600° C. and held for 2 hours to remove the organic components from the green sheets to generate a preform.

After debindering, the preforms were annealed at 1500° C. in a vacuum of $10^{-1}$ Torr for 5 hours at a heating rate of 1° C./min to complete conversion from non-garnet phases of Y—Al—O in the non-emissive layer, including, but not limited to, amorphous yttrium oxides, YAP, YAM or $Y_2O_3$ and $Al_2O_3$ to yttrium aluminum garnet (YAG) phase and increase the final YAG grain size.

Following the first annealing, the preforms were further sintered in a vacuum of $10^{-3}$ Torr at about 1650° C. for 2 hours at a heating rate of 5° C./min and a cooling rate of 10° C./min to room temperature to produce a transparent YAG ceramic sheet of about 0.45 mm thickness. When the laminated green sheets were annealed in the furnace with a graphite heater and carbon felt lining, the preforms were embedded in sacrificial undoped YAG powders of 1 to 5 μm particle size to prevent the samples from being partially reduced to constituent metals due to strong reducing atmosphere. Brownish sintered ceramic sheets were reoxidized in a furnace under vacuum at 1400° C. for 2 hrs at heating and cooling rates of 10° C./min and 20° C./min respectively. The sintered laminated composite exhibited transmittance greater than 70% at 800 nm. When irradiated with a blue LED with peak emission wavelength at 455 nm, a clear boundary between emissive and non-emissive layer can be observed, which indicates that no significant diffusion of cerium occurred from the doped plasma YAG layer to the non-doped YAG layer.

3.4 Comparative Example (SSR Synthesized Emissive Material)

Comparative emissive layers (formed of SSR synthesized emissive materials) were produced as in section 3.2, except that 3.976 of $Y_2O_3$ powder (99.99%, Nippon Yttrium Company Ltd.), 3.014 of $Al_2O_3$ powder (99.99%, grade AKP-30, Sumitomo Chemicals Company Ltd.), 0.0793 g of Cerium (III) nitrate hexahydrate (99.99% pure, Sigma-Aldrich), TEOS (0.0405 g) and 0.141 g dispersant were added to ball mill jars.

A laminate composite of three emissive SSR green sheets (0-3-0, i.e., 3 layers of SSR emissive layers and no non-emissive layers, the three emissive layers having a total pre-sintering thickness of about 290 μm and total post-sintering thickness of about 227 μm) was formed as in section 3.3, corresponding to sample [3-1]. Optical properties were evaluated with the same method as sections 2.5 and 3.5. The result is depicted as "SSR" in FIG. 11 wherein the plural wavelength-converting ceramic layers 22 were laminated, and the wavelength-converting ceramic layer 22 was disposed in the light path 29 from the light source 26 formed on submount 10.

3.5 WCE Determination

Figure 11:
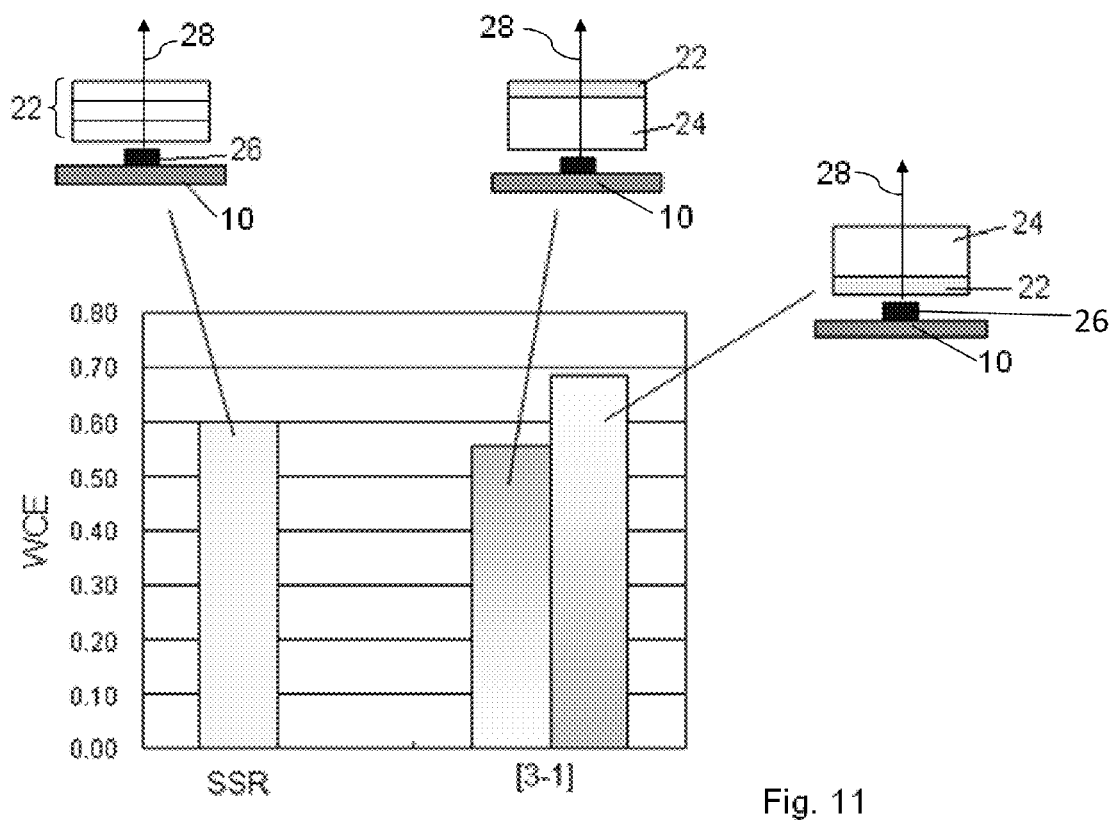
FIG. 11 illustrates a graph comparing the wavelength conversion efficiency (WCE) of a light-emitting device using a ceramic wavelength conversion plate made from solid state synthesized YAG:Ce (SSR), and those of two structures made in accordance the disclosed embodiments.

Wavelength conversion efficiency (WCE) was evaluated by following the procedures described in Section 2.5 above. As shown in FIG. 11, the WCE of the sample SSR (0-3-0, [about 227 μm after second sintering with a [Ce] of about 1.0 mol %]) was about 0.60. The WCE of the sample [3-1] was 0.682 as shown in FIG. 11 wherein the wavelength-converting ceramic layer 22 and the non-emissive layers 24 were laminated, and the wavelength-converting ceramic layer 22 was proximal to the light source 26 formed on the submount 10. When the wavelength-converting ceramic layer 22 was distal to the light source 26 (this refers to the reversed sample [3-1], i.e., 1-3), the WCE of the reversed sample [1-3] was about 0.55 as shown in FIG. 11.

4 Modified Structures

4.1 Modified Structure 1

The procedure of section 3 can be followed except that dies with pillars are used in lamination to produce laminated green sheets with arrayed holes penetrating or partly penetrating the green sheets.

YAG ceramic sheets are produced by following procedures in section 1 for debindering, first sintering, and second sintering.

4.2 Modified Structure 2

The procedure of section 3 can be followed except screen dies are used in lamination to produce laminated green sheets comprising pillars with different aspect ratios. YAG ceramic sheets are produced by following procedures in section 1 for debindering, first sintering, and second sintering.

4.3 Modified Structure 3

One green sheet of 35 μm formed of plasma YAG powder containing $Ce^{3+}$ as an activator of 2.0 mol % with respect to yttrium are produced according to the procedures of section 1. Laminated green sheets consisting of green sheets with activators are produced by following the procedures as in section 1, followed by bonding to a bulk hemisphere ceramic lens with a designed curvature, which is produced by slip casting, vacuum casting, centrifugal casting, dry pressing, gelcasting, hot pressure casting, hot injection molding, extrusion, isostatic pressing followed by debindering and sintering at elevated temperature and controlled atmosphere. Bonding materials comprises polymers, low melting point glasses, and ceramics.

4.4 Modified Structure 4

Plural green sheets comprising $Al_2O_3$ and $Y_2O_3$ (without the activators) having a thickness of 140 μm each are produced by following the procedure set forth in section 3.

One green sheet of 35 μm formed of plasma YAG powder containing $Ce^{3+}$ as an activator of 2.0 mol % with respect to yttrium are produced according to the procedures of section 1. A laminated composite sheet consisting of green sheets with or without activators is produced by following the procedures as in section 1 except that dies with male and female faces and designed curvature are used. Dome shape ceramic sheets are so produced by following procedures in section 1 for debindering, first sintering, and second sintering. Composite ceramic sheets with plural domes are produced with dies having multiple male and female faces by following same procedures.

4.5 Modified Structure 5

The procedure of section 3 is followed except that a pair of rollers is used in lamination of green sheets as shown in FIG. 14. Thickness of laminated green sheets can be changed by adjusting the gap between rollers. YAG ceramic sheets are produced by following procedures in section 1 for debindering, first sintering, and second sintering.

4.6 Modified Structure 6

The procedure of sections 3 and 9 is followed except that one or both rollers comprising a patterned surface as shown in FIG. 15. YAG ceramic sheets are produced by following procedures in section 1 for debindering, first sintering, and second sintering.

5. Another Example

Multiphasic sintered emissive layer/tape: a sample will be made in a manner described in Section 1 using the RF plasma method. The precursor solution will be prepared by dissolving of Yttrium (III) nitrate hexahydrate (99.9% pure, Sigma-Aldrich), Aluminum nitrate nonahydrate (99.97% pure, Sigma-Aldrich), and Cerium (III) nitrate hexahydrate (99.99% pure, Sigma-Aldrich) in 250 ml of deionized water, followed by ultrasonication for 30 min. The nano-powders prepared using this precursor solution will have additional material $Al_2O_3$ for forming the second phase. The nano-powders will be annealed at about 1200° C. for 2 hrs in a $H_2/N_2=3\%/97\%$ ambient. The rate of the increase of temperature will be about 5° C./min. After the annealing, it is anticipated that a yellowish colored powder will be obtained and yttrium aluminum garnet crystalline phase will be determined by XRD. Small XRD peaks of $Al_2O_3$ phase will also be detected in accordance with the amount of second phase material in the Al-rich composition.

The same procedure for preparing the sintered ceramic layers described in Sections 3 will be followed. Additional samples will have different amount of $Al_2O_3$ will be prepared by varying Y/Al ratio.

Scanning electron microscope (SEM) on an FEI Company Scanning Electron Microscope (Hillsboro, Ore, USA) model Inspect F will be taken at an acceleration voltage of 10,000 kv, at 5000× magnification, a work distance of 10.5 mm, using a BSED detector, selected mode A+B; and vacuum pressure at 9.07 e-5 Pa. The laminated composite with varied levels of second phase materials, e.g., $Al_2O_3$ can be cut to provide a cross-sectional surface to observe. Crystalline grain structure with different contrast will be observed by the SEM, and brighter contrast crystalline grain was determined as YAG crystalline phase while darker one was determined as alumina phase by using elemental analysis. By using image processing technique, percentage of alumina phase occupied in YAG phase will be calculated numerically and summarized. The calculated alumina second phase is anticipated to be between 1% to about 10%.

It is anticipated that the results will demonstrate that scattering centers of $Al_2O_3$ in the emissive layer, in combination with the transparent non-emissive layers, will provide greater levels of transmittance as compared emissive layers without scattering centers provided therein.

It will be appreciated by those skilled in the art that various omissions, additions and modifications may be made to the processes described above without departing from the scope of the invention, and all such modifications and changes are intended to fall within the scope of the invention.

We claim:

1. A light emissive ceramic composite laminate comprising:
    at least one wavelength-converting ceramic layer comprising an emissive material; and
    at least one non-emissive layer of a substantially transparent ceramic material, wherein the wavelength-converting ceramic layer and the non-emissive layer are laminated in a thickness direction,
    wherein the light emissive ceramic composite laminate has a wavelength conversion efficiency (WCE) of at least about 0.650.

2. The ceramic composite laminate of claim 1, wherein each non-emissive layer has a thickness greater than that of each wavelength-converting ceramic layer.

3. The ceramic composite laminate of claim 2, wherein a ratio of total thickness of the at least one wavelength-converting ceramic layer to that of the at least one non-emissive layer is about 1/3 or less.

4. The ceramic composite laminate of claim 2, wherein a ratio of total thickness of the at least one wavelength-converting ceramic layer to that of the at least one non-emissive layer is about 1/10 or less.

5. The ceramic composite laminate of claim 1, wherein each wavelength-converting layer and each non-emissive layer are in the form of sintered ceramic tape cast layers.

6. The ceramic composite laminate of claim 1, wherein the emissive material comprises a flow-based thermochemically synthesized material.

7. The ceramic composite laminate of claim 1, wherein the emissive material comprises a radio-frequency inductively-coupled thermal plasma synthesized YAG:Ce.

8. The ceramic composite laminate of claim 1, further comprising at least one additional non-emissive layer laminated on the at least one wavelength-converting ceramic layer opposite to the at least one non-emissive layer.

9. The ceramic composite laminate of claim 1, wherein the emissive material comprises an activating dopant having a concentration of about 0.05 mol % to about 10.0 mol % relative to a primary element of the emissive material, and the substantially transparent ceramic material is a non-doped garnet material.

10. A light-emitting device comprising:
    a light-emitting source for emitting a path of light; and
    a ceramic composite laminate of claim 1 disposed adjacent to the light-emitting source in the path of light to receive light emitted from the light-emitting source.

11. The light-emitting device of claim 10, wherein each non-emissive layer has a thickness greater than that of each wavelength-converting ceramic layer.

12. The light-emitting device of claim 10, wherein each wavelength-converting ceramic layer and each non-emissive layer are in the form of sintered ceramic tape cast layers.

13. The light-emitting device of claim 10, wherein the emissive material comprises a flow-based thermochemically synthesized YAG:Ce.

14. The light-emitting device of claim 10, wherein the emissive material comprises a radio-frequency inductively-coupled thermal plasma synthesized YAG:Ce.

15. The light-emitting device of claim 10, wherein the wavelength-converting ceramic layer is disposed between the non-emissive layer and the light-emitting source.

16. The light-emitting device of claim 10, wherein the non-emissive layer is disposed between the wavelength-converting ceramic layer and the light-emitting source.

17. The light-emitting device of claim 10, wherein the emissive material comprises an activating dopant having a concentration of between about 0.05 mol % to about 10.0 mol % relative to a primary element of the emissive material, and the non-emissive material is a non-doped garnet material.

18. The light-emitting device of claim 10, wherein a ratio of total thickness of the at least one wavelength-converting ceramic layer to that of the at least one non-emissive layer is about 1/3 or less.

19. The light-emitting device of claim 18, wherein a ratio of total thickness of the at least one wavelength-converting ceramic layer to the at least one non-emissive layer is about 1/10 or less.

20. A method of manufacturing an emissive YAG:Ce composite laminate, comprising:
    providing at least one cast tape formed of a non-emissive material and at least one cast tape formed of an emissive material;
    stacking portions of the cast tapes to form an assembly;
    compressing the assembly to produce a preform;
    heating the preform to produce a green preform; and
    sintering the green preform to produce an emissive YAG:Ce composite laminate, wherein after the sintering, the emissive YAG:Ce composite laminate has a wavelength conversion efficiency (WCE) of at least about 0.650.

21. The method of claim 20, wherein the providing of the cast tape of the emissive material comprises providing an emissive cast tape having a wavelength efficiency of at least about 0.650 as measured after the sintering.

22. The method of claim 20, wherein the providing of the cast tape formed of the non-emissive material comprises:
    mixing about 3 parts by molarity of $Y_2O_3$, 5 parts by molarity of $Al_2O_3$, dispersant, sintering aid, and organic solvent;
    ball milling the mixture using balls of a material containing substantially no Y, no Al, and no Ce to produce a milled first slurry;
    mixing a type 1 and type 2 plasticizer and organic binder into said first slurry to produce a second slurry;
    milling the second slurry to produce a milled second slurry;
    tape casting the milled second slurry to produce the non-emissive cast tape;
    drying the non-emissive cast tape to produce a dried tape;
    heating and compressing plural layers of the dried tape to form a laminated green sheet;
    heating the laminated green sheet to remove organic components; and
    sintering the green sheet to form a transparent or translucent non-emissive ceramic sheet used as the cast tape.

23. The method of claim 22, wherein the non-emissive cast tape comprises YAG powder, each layer of said cast tape having a thickness of about 100 to about 200 µm.

24. The method of claim 23, wherein the providing of the cast tape having a wavelength conversion efficiency of at least about 0.650 comprises:
- performing flow-based thermochemical synthesis of stoichiometrically correct phosphor nanoparticles, the nanoparticles having a particle size of between about 30 nm and about 500 nm;
- preannealing the nanoparticles at a temperature sufficient to substantially convert the nanoparticles to substantially or nearly all garnet phase phosphor nanoparticles with increased particle sizes;
- mixing the preannealed phosphor nanoparticles, a dispersant, a sintering aid, and an organic solvent;
- milling the mixture using ball milling using balls comprised of a material not containing any non-oxygen components or potential dopants for the material being milled to produce a milled first slurry;
- mixing a type 1 and type 2 plasticizer and organic binder into said first slurry to produce a second slurry;
- milling the second slurry to produce a milled second slurry;
- tape casting the milled second slurry to produce a cast tape;
- drying the cast tape to produce a dried tape;
- heating and compressing a plurality of layers of the dried tape to form a laminated green sheet;
- heating laminated green sheet to remove organic components; and
- sintering the green sheet to form a transparent or translucent emissive ceramic sheet used as the cast tape.

25. The method of claim 24, wherein the nanoparticles comprise a cerium-doped yttrium-aluminum oxide synthesized by a flow-based thermochemically synthesis method.

26. The method of claim 24, wherein the nanoparticles are a cerium-doped yttrium-aluminum oxide synthesized using a radio-frequency inductively-coupled thermal plasma.

27. The method of claim 20, further comprising defining volume or surface features within said composite laminate.

28. The method of claim 20, further comprising defining void features within said composite laminate, said void features being selected from apertures extending completely through the composite laminate, or apertures incompletely extending into the composite laminate.

29. The method of claim 20, further comprising making outwardly extending surface features on a surface of the composite laminate.

30. An emissive ceramic composite laminate manufactured according to the method of claim 20.

31. A light-emitting device comprising the emissive ceramic composite laminate manufactured according to the method of claim 20.

32. A light emissive ceramic composite laminate comprising:
- at least one wavelength-converting ceramic layer comprising an emissive material and a scattering material; and
- at least one non-emissive layer of a substantially transparent ceramic material, wherein the wavelength-converting ceramic layer and the non-emissive layer are laminated in a thickness direction, wherein the laminated composite has a total transmittance of between about 40% to about 85%.

33. The light emissive ceramic laminate of claim 32, wherein the emissive material is YAG:Ce.

34. The light emissive ceramic laminate of claim 32, wherein the scattering material comprises metal oxides selected from the group $Al_2O_3$, $Y_2O_3$ and MgO.

35. The light emissive ceramic laminate of claim 32, further comprising at least one additional non-emissive layer laminated on the at least one wavelength-converting ceramic layer opposite to the at least one non-emissive layer.

36. The light emissive ceramic laminate of claim 32, wherein the index of refraction of the non-emissive layer is less than the index of refraction of the wavelength-converting ceramic layer.

* * * * *